United States Patent [19]
Ochi et al.

[11] Patent Number: 5,808,467
[45] Date of Patent: Sep. 15, 1998

[54] RF PROBE AND INSPECTION SYSTEM USING NMR USING THE SAME

[75] Inventors: Hisaaki Ochi, Kodaira; Yo Taniguchi; Kenichi Okajima, both of Hachiouji; Yoshitaka Bito, Kokubunji; Etsuji Yamamoto, Akishima, all of Japan

[73] Assignees: Hitachi, Ltd.; Hitachi Medical Corporation, both of Tokyo, Japan

[21] Appl. No.: 653,315

[22] Filed: May 24, 1996

[30] Foreign Application Priority Data

May 31, 1995 [JP] Japan .................................. 7-133476
Jul. 3, 1995 [JP] Japan .................................. 7-167265

[51] Int. Cl.⁶ ..................................................... G01V 3/00
[52] U.S. Cl. .......................................... 324/309; 324/318
[58] Field of Search .................................... 324/300, 306, 324/307, 309, 312, 314, 316, 318, 322

[56] References Cited

U.S. PATENT DOCUMENTS 5,097,210  3/1992  Requardt et al. ........................ 324/318
5,307,014  4/1994  Laub ...................................... 324/306

OTHER PUBLICATIONS

"An Introduction to Wavelets", Chui, (Reference A) and Chapter 3 titled Wavelet Transforms and Time–Frequency Analysis, pp. 49–80.
"The Wavelet Transform, Time–Frequency Localization and Signal Analysis", Daubechies, IEEE Transactions on Information Theory, vol. 36, No. 5, Sep. 1990, pp. 961–1005, (Reference B).
"MRI Diagnostics (Basic and Clinic)", Asakura Shoten, pp. 69–78 (1988).
"Wavelet–Encoded MR Imaging" by John Weaver, et al, Magnetic Resonance in Medicine, vol. 24, pp. 275–287 (1992).
The Institute of Electronics Information and Communication Engineers, 1994 Spring National Convention Work, Course Book, pp. 73–87.
"Wavelet Encoded MR Imaging (Implementation)" by K. Oshio, et al, Proc. Soc. Magn. Med. 12th annual Scientific Meeting, Book of Abstracts, 3, p. 1213 (1993).
Journal of Magnetic Resonance, 29, pp. 355–373 (1978) by P. Manifeld, et al.

*Primary Examiner*—Louis M. Arana
*Attorney, Agent, or Firm*—Antonelli, Terry, Stout & Kraus, LLP

[57] ABSTRACT

In the inspection system using nuclear magnetic resonance comprising magnetic field generators such as a static magnetic field, a gradient magnetic field, and an RF magnetic field, an RF probe for detecting an NMR signal from a subject, and a calculator for operating a detected signal by the RF probe, a RF probe for detection comprises a plurality of coils arranged in the predetermined direction and includes a plurality of switching elements and the inspection system selects two or more coils from the plurality of coils for each measurement of NMR signals, turns the switching elements connected to the selected coils ON, turns the switching elements connected to coils other than the selected coils OFF, changes a combination of two or more coils for each measurement of NMR signals, and changes the sensitivity distribution of the RF probe in the predetermined direction according to the Wavelet basis function for each measurement of NMR signals.

29 Claims, 31 Drawing Sheets

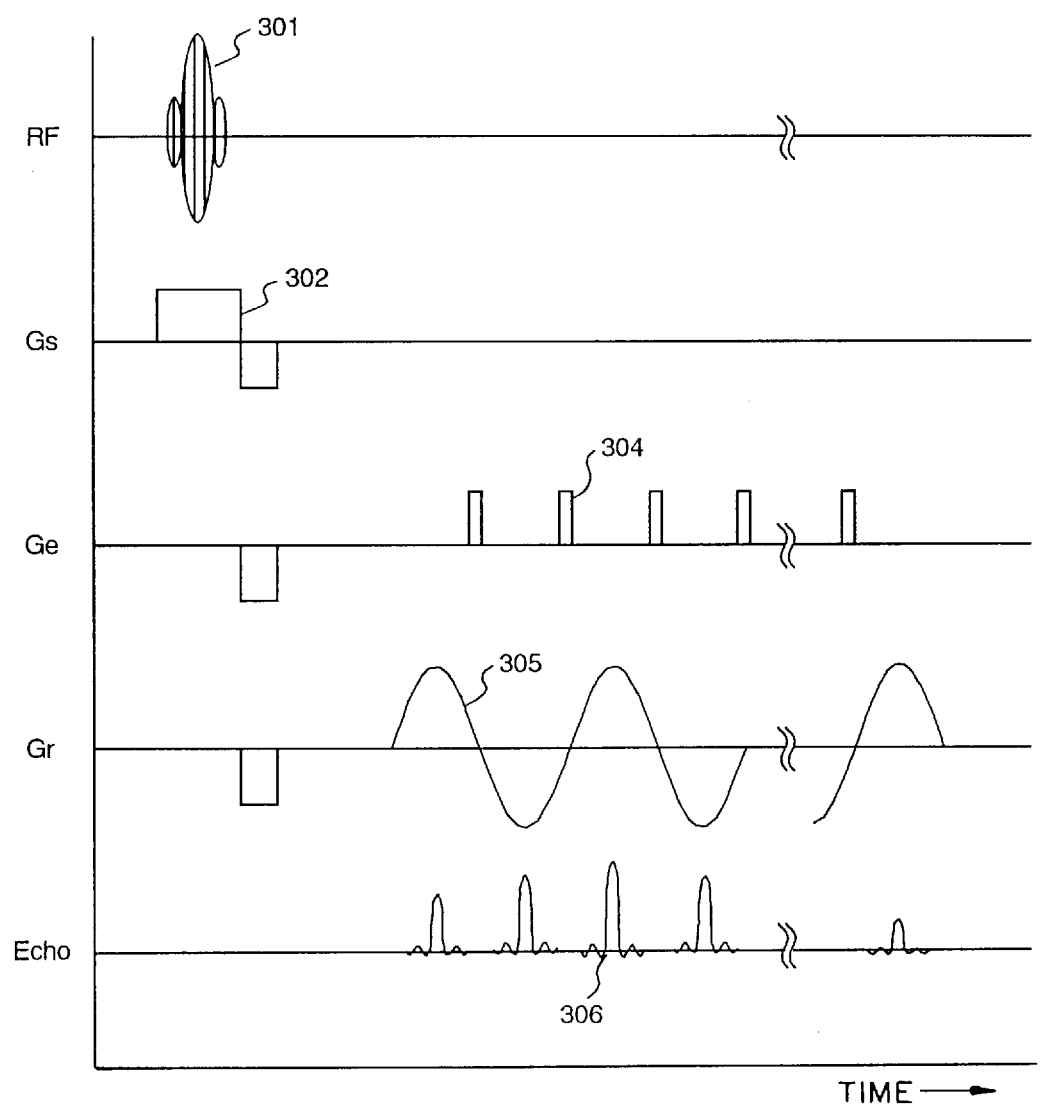

RF PROBE AND INSPECTION SYSTEM USING NMR USING THE SAME

BACKGROUND OF THE INVENTION

The present invention relates to an RF probe and an inspection system using it and more particularly to a system for imaging for a short time (hereinafter abbreviated to MRI (magnetic resonance imaging)).

A magnetic resonance imaging system is a system for measuring a slice image of a subject using a nuclear magnetic resonance phenomenon. The principle of magnetic resonance imaging (MRI) is described in detail in "MRI Diagnostics (Basic and Clinic)", Asakura Shoten, p. 69–78, 1988. In an MRI system, an RF pulse of a frequency in proportion to the intensity of static magnetic field so as to excite nuclei in a subject is applied to the subject. As this exciting RF pulse, position information of the perpendicular direction to the read-out direction is encoded to a signal by using a pulse in the shape that the basis function of Wavelet transform is Fourier-transformed and an imaging method of obtaining the position information by inverse Wavelet transform has been developed (J. B. Weaver, et al.: "Wavelet-Encoded MR Imaging", Magnetic Resonance in Medicine, vol. 24, pp 275–287, 1992).

FIG. 1 shows a typical pulse sequence of the Wavelet—Encoding imaging of the aforementioned prior art. The horizontal axis indicates the time and the vertical axis indicates the intensity of an RF pulse or of the gradient magnetic field. In FIG. 1, numeral 1 indicates an exciting RF pulse, 2 an encoding gradient magnetic field, 3 a read-out gradient magnetic field, 4 a slicing gradient magnetic field, and 6 an NMR signal.

In FIG. 1, the encoding gradient magnetic field (Ge) 2 and the exciting RF pulse (RF) 1 are applied to a subject at the same time first so as to excite the nuclei in a specific area in the subject. A profile in the specific area in the application direction of the encoding gradient magnetic field is in a form of the Wavelet basis function. When the slicing gradient magnetic field (Gs) 4 and a π pulse (RF) 11 are applied to the subject at the same time in this case, the magnetic moment of the nuclei in a slice with a specific width which is perpendicular to the application direction of the slicing gradient magnetic field inverts and the magnetic moment of the nuclei outside the slice varies in phase. When the read-out gradient magnetic field (Gr) 3 is applied before and after the π pulse 11, the NMR signal 6 is read via the RF probe. This process is repeated by changing the position of the specific area to be excited by changing the intensity of the encoding gradient magnetic field 2 or changing the carrier frequency of the exciting RF pulse 1. Namely, by changing the scale parameter of the Wavelet basis function which will be described later by changing the intensity of the encoding gradient magnetic field 2 and by changing the translation parameter which will be described later by changing the carrier frequency of the exciting RF pulse 1, a plurality of NMR signals necessary for inverse Wavelet transform are obtained.

Each signal of the plurality of NMR signals has position information of the application direction of the read-out gradient magnetic field 3 and different position information of the application direction of the encoding gradient magnetic field 2 because the specific area to be excited varies with each signal. By performing inverse Wavelet transform to a measured NMR signal in the application direction of the encoding gradient magnetic field and inverse Fourier transform to it in the application direction of the read-out gradient magnetic field, a two-dimensional image of a specific slice selected by the slicing gradient magnetic field 4 is obtained.

As described in the document by K. Aizawa and C. K. Cheong ("Wavelet Transform and Signal Analysis", Introduction to Advanced Image Processing Technique, The Institute of Electronics Information and Communication Engineers, 1994 Spring National Convention Work, Course Book, pp 73–87), the Wavelet transform is one of the signal analysis methods and develops an optional function f(t) ∈ $L^2(R)$, where ($L^2(R)$ indicates a real Hilbert space allowing a double integral and means a function space having finite energy) by using a function $\psi_{a,b}(t)$ generated from one function ψ(t) (Wavelet generating function) localized both on a time (space) basis and on a frequency basis as a basis function.

The Wavelet basis function is defined by Formula 1.

$$\psi_{a,b}(t) = \{1/\sqrt{a}\}\psi\{(t-b)/a\} \qquad \text{Formula 1}$$

The Wavelet basis function $\psi_{a,b}(t)$ shown in Formula 1 is a function obtained by reducing or enlarging the Wavelet function ψ(t) by the scale parameter a and shifting it by the translation parameter b. Symbols a and b indicate a positive real number (a∈R+) and a real number (b∈R) respectively and $\{1/\sqrt{a}\}$ indicates a parameter for normalizing the norm of $\psi_{a,b}(t)$. It is assumed that ψ(t) exists locally around the home position t=0 in a width of a time of Δt and the Fourier transform ψ(ω) thereof exists locally in the band of frequency-domain [$\omega_L$, $\omega_H$] with $\omega_C$ indicated by Formula 2 shown below used as a center frequency:

$$\omega_C = (\omega_L + \omega_H)/2 \qquad \text{Formula 2}$$

In this case, the Wavelet basis function $\psi_{a,b}(t)$ exists locally around a time of b such as b−aΔt/2≦t≦b+aΔt/2 in a width of aΔt. The Fourier transform $\psi_{a,b}(\omega)$ thereof is expressed by Formula 3 shown below with j as an imaginary unit:

$$\psi_{a,b}(\omega) = \{\sqrt{a}\}\psi(a\omega)\exp\{-j\omega b\} \qquad \text{Formula 3}$$

Therefore, it is found that the Fourier transform has pass-band characteristics of center frequency $\omega_C/a$ and band width Δω/a.

Continuous Wavelet transform is defined as follows: The Wavelet transform $W_f(a,b)$ for a continuous signal f(t) is defined as Formula 4 shown below as an inner product of f(t) and the Wavelet basis function $\psi_{a,b}(t)$.

$$W_f(a,b) = <f(t), \psi_{a,b}(t)> = \{1/\sqrt{a}\}\int f(t)[\psi\{(t-b)/a\}]dt \qquad \text{Formula 4}$$

In Formula 4, a symbol <f, g> indicates an inner product of f and g, and a symbol [ ] indicates complex conjugation, and an integral ∫ is performed within a range from −∞ to ∞. The frequency resolution of the Wavelet basis function $\psi_{a,b}(t)$ is low for a small value of a and high for a large value of a. On the other hand, with respect to time resolution, since a,b(t) has a width according to the size of a, the time resolution of $\psi_{a,b}(t)$ is high for a small value of a and low for a large value of a. As mentioned above, the resolutions of time and frequency of the Wavelet basis function $\psi_{a,b}(t)$ vary according to the scale parameter.

When the Wavelet function ψ(t) satisfies the conditions shown in Formula 5 that it has a sufficient decay characteristic when t is large and the average value for the whole time is zero, inverse transform to the signal f(t) from the Wavelet transform $W_f(a,b)$ is given by Formula 6.

$$C_\psi = \int |\Psi(\omega)|^2/|\omega| d\omega < \infty \qquad \text{Formula 5}$$

$$f(t) = \{1/C_\psi\} \iint W_f(a, b) \psi_{a,b}(t) da db/a^2 \qquad \text{Formula 6}$$

In Formula 5, an integral $\int$ is performed within a range from $-\infty$ to $\infty$ and in Formula 6, an integral $\int da$ is performed in an area of $a \in R+$ and an integral $\int db$ is performed in an area of $b \in R$.

If the conditions described in the document by Aizawa and Cheong which are explained above are satisfied, the Wavelet transfer and inverse transfer can be performed.

When the parameter (a, b) is made discrete and the normalized orthogonal basis function is used as a Wavelet basis function $\psi m,n(t)$, the Wavelet transform formula is switched from Formula 4 to Formula 7 as shown below:

$$W_f(m,n) = <f(t), \psi m, n(t)> \qquad \text{Formula 7}$$

and the signal f(t) is restructured as shown by Formula 8 from the Wavelet transform.

$$f(t) = \Sigma < f(t), \psi_{m,n}(t) > \psi_{m,n}(t) = \Sigma W_f(m, n) \psi_{m,n}(t) \qquad \text{Formula 8}$$

In Formula 8, the addition $\Sigma$ is performed for m and n (the number of normalized orthogonal basis functions).

With respect to the nuclear magnetic resonance imaging art, the use of the Lemarie-Baattle Wavelet basis function as a Wavelet basis function is described in "K. Oshio, L. P. Panych and F. A. Jolesz: "Wavelet Encoded MR Imaging (Implementation)", Proc. Soc. Magn. Med. 12th annual Scientific Meeting, Book of Abstracts, 3, P 1213, 1993".

With respect to an imaging sequence of a nuclear magnetic resonance imaging system, various methods are proposed. Among them, as a representative of imaging sequences having a shortest imaging time which are called ultra-fast imaging, the echo planar imaging described in Journal of Magnetic Resonance, 29, pp 355–373, 1978) may be cited. According to this imaging, a two-dimensional image of a specific slice can be measured for several ten seconds.

A typical pulse sequence of the echo planar imaging is shown in FIG. 32. In FIG. 32, the horizontal axis indicates the time and the vertical axis indicates the intensity of an RF pulse or of the gradient magnetic field. Numeral 301 indicates an exciting RF pulse, 302 a slicing gradient magnetic field, 304 a phase encoding gradient magnetic field, 305 a read-out gradient magnetic field, and 306 an NMR signal.

In this sequence, the exciting RF pulse 301 is applied to a subject at the same time with the slicing gradient magnetic field 302 so as to excite a specific slice. Next, when the read-out gradient magnetic field 305 is applied to the subject at the same time with the phase encoding gradient magnetic field 304, the NMR signal 306 is read via the RF probe.

The NMR signal 306 comprises a plurality of echo signals and each echo has a peak value when the integral value of the read-out gradient magnetic field 305 becomes zero. At this time, each echo has position information of the application direction of the read-out gradient magnetic field 305 and the amount of addition of the phase encoding gradient magnetic field varies with each echo, so that a plurality of echos having different position informations of the application direction of the phase encoding gradient magnetic field 304 are measured.

By performing two-dimensional Fourier transform to a measured NMR signal, a two-dimensional image of the excited slice can be obtained.

SUMMARY OF THE INVENTION

In the Wavelet-Encoding imaging of the prior art, the nuclei in a specific area in a subject are excited so that the profile in the application direction of the encoding gradient magnetic field is set in a form of the Wavelet basis function and a signal from the specific area is measured. The above process for measuring a signal is repeated by changing the position of the specific area to be excited so as to obtain data necessary for reconfiguration of an image. When a specific position having an imaging slice is taken into account and Wavelet transform is performed to it, it is necessary to excite the specific position several times. When the nuclei in a certain specific position are excited several times in MRI, the repetitive time cannot be made shorter so much due to a physical restriction of waiting for magnetization recovery (longitudinal relaxation). The repetitive time is generally set to about 1 second often, so that a problem arises in the Wavelet-Encoding imaging of the prior art that the imaging time cannot be set to less than the repetitive time.

An object of the present invention is to provide an inspection system using nuclear magnetic resonance for imaging free of the physical restriction of waiting for magnetization recovery (longitudinal relaxation) when nuclei are excited several times.

A typical pulse sequence of the echo planar imaging is shown in FIG. 32.

In a magnetic resonance imaging system using the pulse sequence shown in FIG. 32, as mentioned above, to assign position information of the X direction and the Y direction of the slice to an NMR signal obtained from the slice, the read-out gradient magnetic field is applied by changing the amount of addition of each phase encoding gradient magnetic field. However, a problem remains that an eddy current is generated in the conductor portion in the system when the gradient magnetic field is switched due to application of the gradient magnetic field and an artifact appears in an image by the magnetic field generated by the eddy current. Another problem also remains that a force based on the Fleming's left-hand rule is generated when the gradient magnetic field is switched and noise based on it is generated.

Another object of the present invention is to provide an inspection system using nuclear magnetic resonance for suppressing an artifact and noise generated by application of the gradient magnetic field as much as possible.

The inspection system using nuclear magnetic resonance of the present invention comprises magnetic field generation means such as a static magnetic field, a gradient magnetic field, and an RF magnetic field, an RF probe for detecting an NMR signal from a subject, and a calculator (processing unit) for operating a detected signal by the RF probe and is characterized in that the inspection system further comprises a means for changing the sensitivity distribution of the RF probe in the predetermined direction for each measurement of NMR signals.

The inspection system using nuclear magnetic resonance of the present invention is characterized in that the inspection system excites the whole imaging area by an RF probe for exciting and then acquires image data by changing the sensitivity distribution of an RF probe for detection in the specific direction for each measurement of NMR signals according to the Wavelet basis function.

Explaining more in detail, the inspection system using nuclear magnetic resonance of the present invention comprises magnetic field generation means such as a static magnetic field, a gradient magnetic field, and an RF magnetic field, an RF probe for detection for detecting an NMR signal from a subject, a calculator (processing unit) for operating a detected signal by the RF probe for detection, and an output means of operation results by the calculator and detects the NMR signal by changing the sensitivity distribution of the RF probe for detection in the predetermined direction several times according to the Wavelet basis function. The RF probe for detection comprises a plurality of coils arranged in the predetermined direction, and each coil of the plurality of coils includes a plurality of switching elements, and the sensitivity distribution is changed for each measurement of NMR signals by turning the switching elements ON or OFF.

Two or more coils are selected from the plurality of coils constituting the receiving RF coil for each measurement of NMR signals, and the switching elements connected to the selected coils are turned ON, and the switching elements connected to coils other than the selected coils are turned OFF, and a combination of two or more coils is changed for each measurement of NMR signals. The calculator (processing unit) operates a detected signal, also controls each unit (each means) of the inspection system using nuclear magnetic resonance, and functions as a sequence control means for executing control of the predetermined pulse sequence.

In the system of the present invention, the nuclei in the imaging area are excited once at first by using the RF probe for exciting, so that a sheet of image data can be obtained free of the physical restriction of waiting for magnetization recovery. By changing a combination of two or more coils constituting the RF probe for detection by ON-OFF control of the switching element connected to each coil for each measurement of NMR signals, position information of the application direction of the phase encoding gradient magnetic field or the read-out gradient magnetic field can be assigned and position information can be obtained without the phase encoding gradient magnetic field or the read-out gradient magnetic field being applied.

As explained above, the present invention having the constitution that the sensitivity distribution of the RF probe for detection in the specific direction is changed according to the Wavelet basis function for each measurement can obtain a sheet of image data by one excitation and can image a subject free of the physical restriction of waiting for magnetization recovery, so that the imaging time can be shortened. Furthermore, there is no need to apply the phase encoding gradient magnetic field or the read-out gradient magnetic field, so that an eddy current and noise generated in the conductor portion in the system when the gradient magnetic field is switched can be reduced. As a result, the first object of the present invention is accomplished.

The inspection system using nuclear magnetic resonance of the present invention having another constitution comprises a means for generating a gradient magnetic field for specifying the slice of a subject and a means for assigning position informations of the X and Y directions intersecting orthogonally each other on the slice to a magnetic resonance signal from the subject and is characterized in that as a means for assigning position information of one direction such as the X direction or the Y direction, the inspection system has a means for providing a sensitivity distribution inclined in the aforementioned one direction to the RF probe for detecting an NMR signal and changing the sensitivity distribution.

The inspection system using nuclear magnetic resonance having the aforementioned constitution can assign position information of the gradient direction of the sensitivity distribution by providing a gradient sensitivity distribution on the probe for detecting an NMR signal and changing the sensitivity distribution. Since the inspection system can assign position information of the gradient direction of the sensitivity distribution like this, the inspection system can calculate density information at each position in the gradient direction of the sensitivity distribution. Therefore, there is no need to assign the gradient magnetic field in which position information of the gradient direction of the sensitivity distribution is assigned and an occurrence of an artifact and noise when the gradient magnetic field is assigned can be suppressed. As a result, the second object of the present invention is accomplished.

The present invention may be summarized as shown below with reference to FIGS. 12 and 24. A slicing gradient magnetic field (Gs) 4 and an exciting RF pulse 1 are applied to a subject at the same time so as to excite the predetermined slice and generate an FID signal 96. A phase encoding gradient magnetic field (Ge) 2 for assigning position information of the y direction is applied to the subject for each measurement of FID signals. By changing the sensitivity distribution of the RF probe in the x direction at each time between two π pulses (the sensitivity distribution at the time $t_1$ is $f_1$, and the sensitivity distribution at the time $t_2$ is $f_2$, - - - , and the sensitivity distribution at the time $t_N$ is $f_N$) according to the Wavelet basis function, an FID signal is measured and an x-profile is obtained by inverse Wavelet transform from the FID signal. According to the present invention, there is no need to apply the read-out gradient magnetic field, and a sheet of image data can be obtained by one excitation, and a restriction of waiting for magnetization recovery is not imposed, and the imaging time is shortened, and an artifact and noise generated in the conductor portion in the system when the gradient magnetic field is assigned can be reduced.

According to the present invention, the inspection system using nuclear magnetic resonance comprises a means for generating a gradient magnetic field for specifying the slice of a subject and a means for assigning position informations of the X and Y directions intersecting orthogonally each other on the slice to a magnetic resonance signal from the subject and is structured so that as a means for assigning position information of one direction such as the X direction or the Y direction, a sensitivity distribution inclined in the aforementioned one direction is provided on the RF probe for detecting an NMR signal and the sensitivity distribution is changed. According to the present invention, an occurrence of an artifact and noise due to use of the gradient magnetic field can be suppressed.

BRIEF DESCRIPTION OF THE DRAWINGS

FIG. 32 is an illustration showing an example of a conventional measurement device using nuclear magnetic resonance.

DESCRIPTION OF THE PREFERRED EMBODIMENTS

Figure 23:
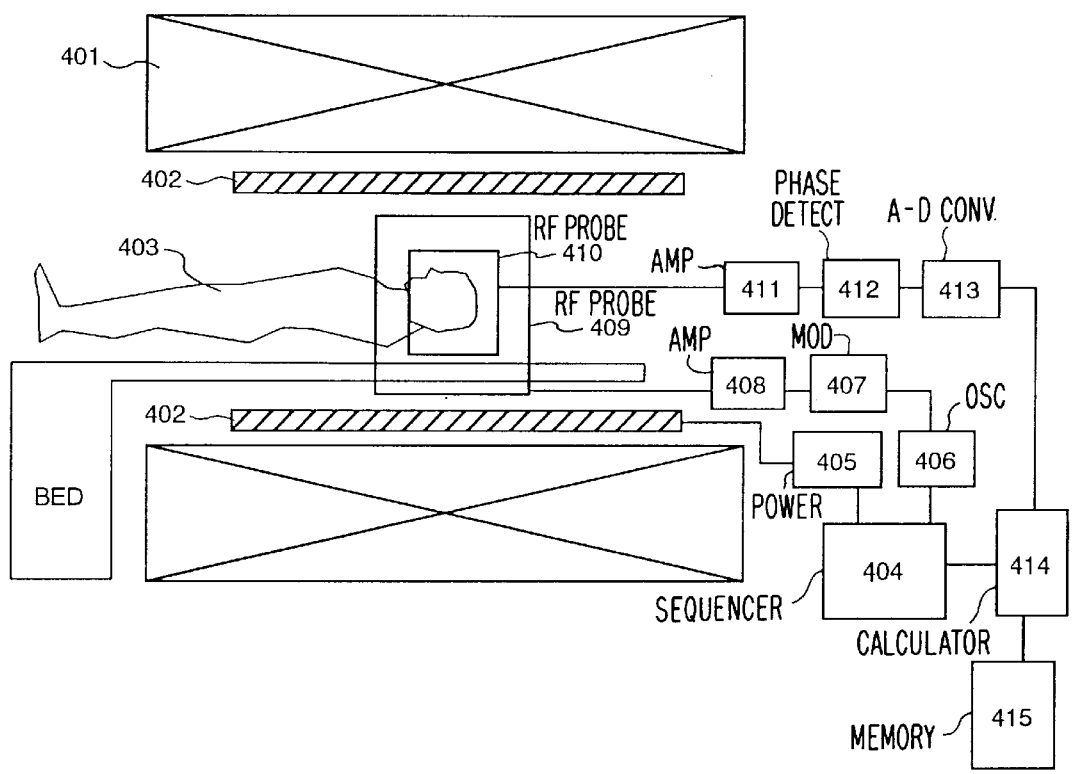
FIG. 23 is a block diagram showing an example of an inspection system using nuclear magnetic resonance of the present invention.

The embodiments of the present invention will be explained hereunder with reference to the accompanying drawings. FIG. 23 is a block diagram showing an example of an inspection system using nuclear magnetic resonance. In FIG. 23, numeral 401 indicates a coil for generating a static magnetic field, 402 a coil for generating a gradient magnetic field, and 403 a subject and the subject is installed in the coil 401 and the coil 402 for generating a gradient magnetic field. A sequencer 404 sends an instruction to a gradient magnetic field power source 405 and an RF oscillator 406 so as to generate a gradient magnetic field and an RF magnetic field. The gradient magnetic field is generated from the coil 402 for generating a gradient magnetic field and adds position information to a signal generated from the subject. The RF magnetic field is applied to the subject 403 by an RF probe for irradiating (RF probe for exciting) 409 via an RF modulator 407 and an RF amplifier 408. The signal generated from the subject is received by an RF probe for detection 410, sent to a calculator 414 via an amplifier 411, a phase detector 412, and an A-D converter 413, and processed there. A signal and measurement conditions may be stored in a memory 415 when necessary.

First embodiment

Figure 2:
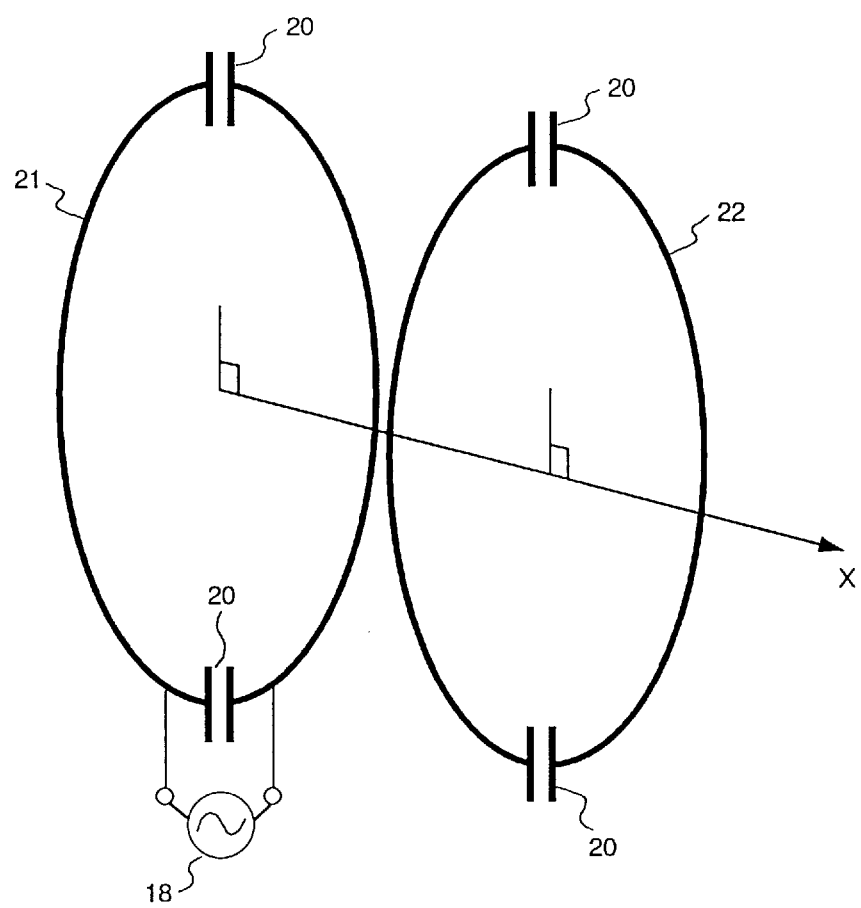
FIG. 2 is a drawing showing an example of the constitution of an RF probe comprising two loop coils of the present invention for changing the sensitivity distribution of an RF probe for detection in the specific direction on a time basis according to the Wavelet basis function.
Figure 3:
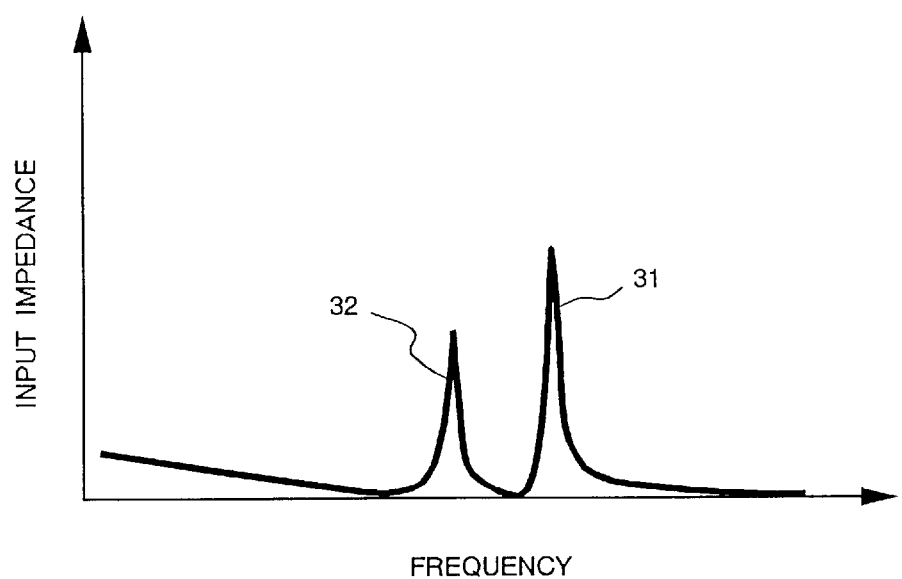
FIG. 3 is a drawing showing the frequency characteristic of the input impedance of the two loop coils shown in FIG. 2.
Figure 4:
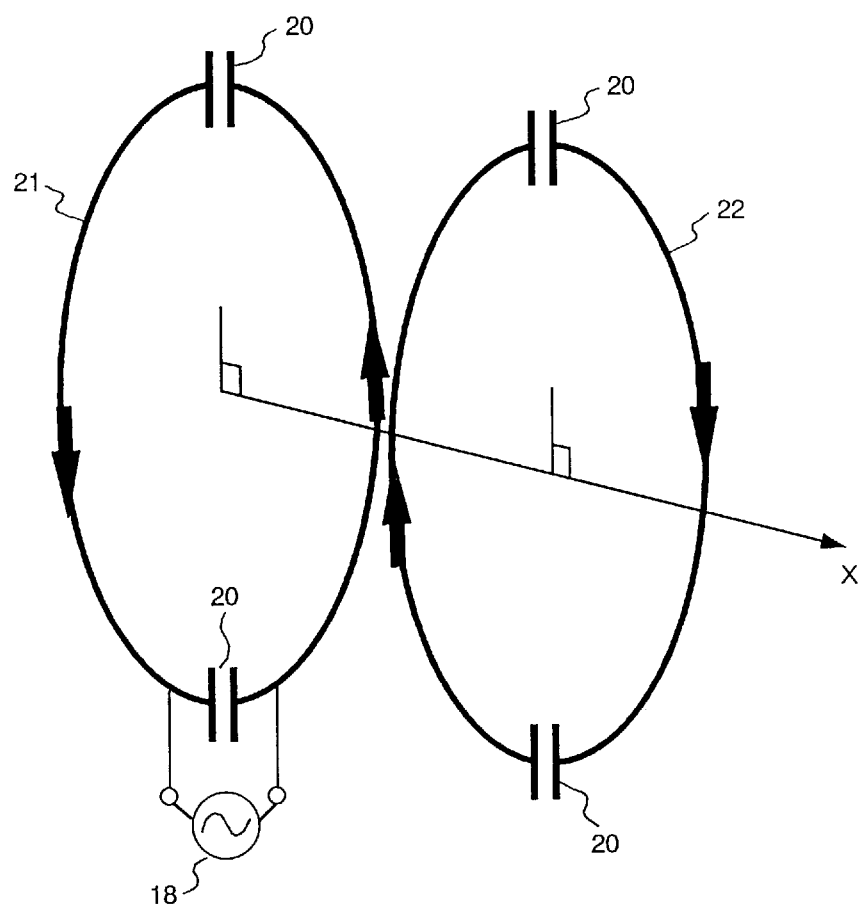
FIG. 4 is a drawing showing the current distribution of the two loop coils shown in FIG. 2.

The first embodiment of the present invention will be explained. Firstly, an example of the constitution of an RF probe for changing the sensitivity distribution of an RF probe for detection in the specific direction on a time basis according to the Wavelet basis function shown in Formula 1. As shown in FIG. 2, the RF probe used in this embodiment comprises loop coils 21 and 22 having a capacitor 20 respectively. The loop coils 21 and 22 are arranged perpendicularly to the x direction respectively. When power is supplied from a feed point 18 of the loop coil 21, the frequency characteristic of the input impedance has two peaks 31 and 32 as shown in FIG. 3. At the peak 31 having a higher frequency among the peaks shown in FIG. 3, the current distributions of the two loop coils are opposite to each other in current as shown in FIG. 4.

Figure 5:
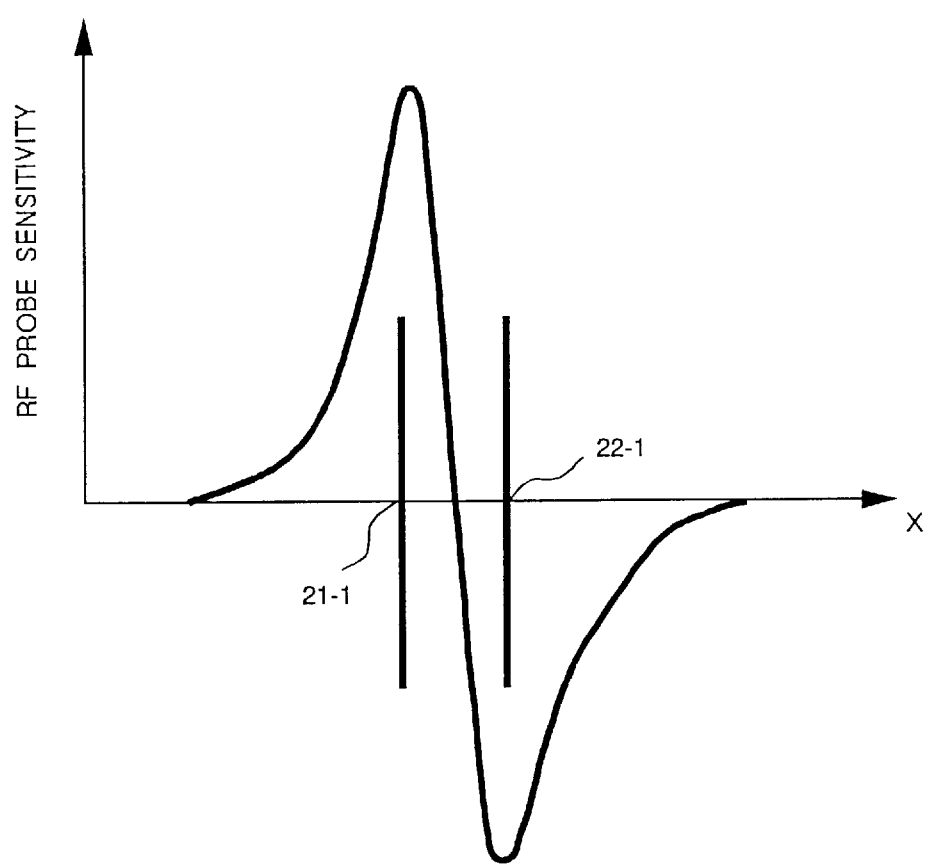
FIG. 5 is a drawing showing the sensitivity distribution of the two loop coils shown in FIG. 2 in the x direction.

When the direction of the static magnetic field of the MRI system is perpendicular to the x direction, the sensitivity distribution of the RF probe in the x direction has peaks in x coordinate positions 21-1 and 22-1 where the loop coils 21 and 22 are arranged as shown in FIG. 5. When the distance between the two loop coils is increased, the sensitivity distribution of the RF probe in the x direction changes as shown in FIG. 6 and has peaks in x coordinate positions 21'-1 and 22'-1 where the loop coils 21 and 22 are arranged and the peak positions are different from those shown in FIG. 5.

Figure 6:
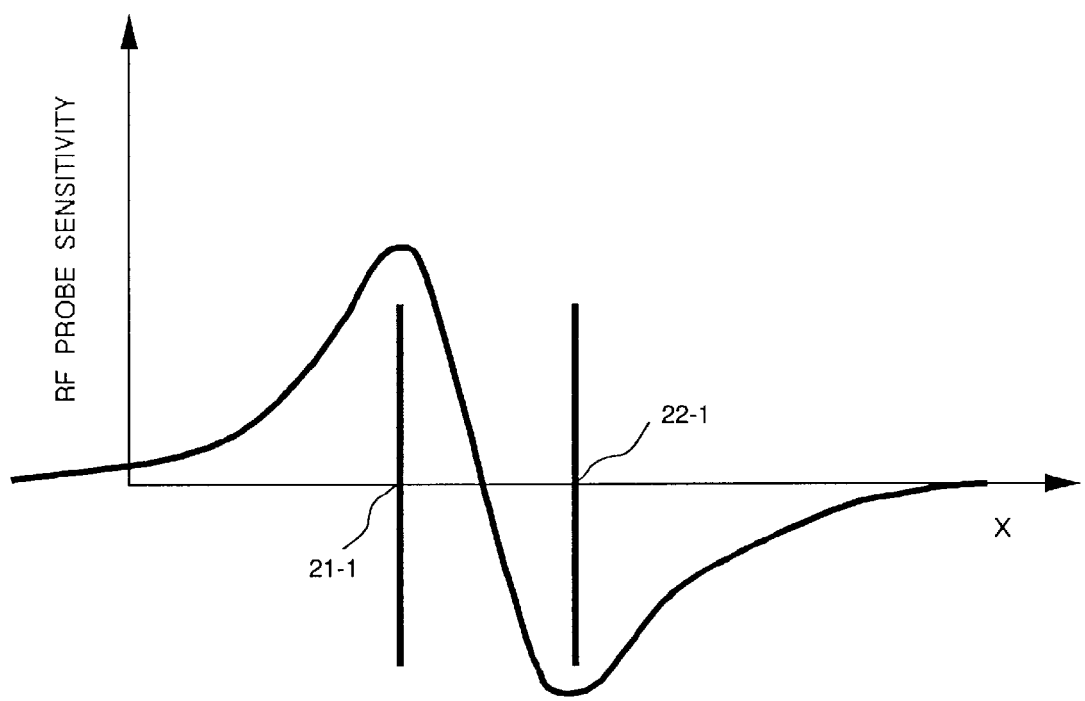
FIG. 6 is a drawing showing the sensitivity distribution of the two loop coils shown in FIG. 2 in the x direction.

For example, when the sensitivity distribution shown in FIG. 5 is approximated to a function ψ(x) which locally exists spatially, by changing the distance between the two loop coils, the function ψ(x) can be reduced or enlarged in the horizontal direction (X axis) and by changing the x coordinate positions where the loop coils 21-1 and 22-1 are arranged, the peak position of the sensitivity distribution of the RF probe in the x direction can be shifted in the x direction as shown in FIGS. 5 and 6. Namely, when the function ψ(x) is used as a Wavelet generating function and it is assumed that the distance between the two loop coils is a scale parameter a and the x coordinate position of the peak position 22-1 of the sensitivity distribution of the loop coil 22 is a translation parameter b, the Wavelet basis function shown in Formula 1 can be obtained from the function ψ(x) expressing the sensitivity distribution of the coil shown in FIG. 5. The function ψ(x) approximating to the sensitivity distribution shown in FIG. 5 can be obtained, for example, by developing the sensitivity distribution of the coil shown in FIG. 5 into Fourier series and approximating to a finite series.

According to this embodiment, the scale parameter a and the translation parameter b held by the Wavelet basis function which are obtained as mentioned above are set by the position relation of a plurality of coils constituting the RF probe for detection.

Figure 7:
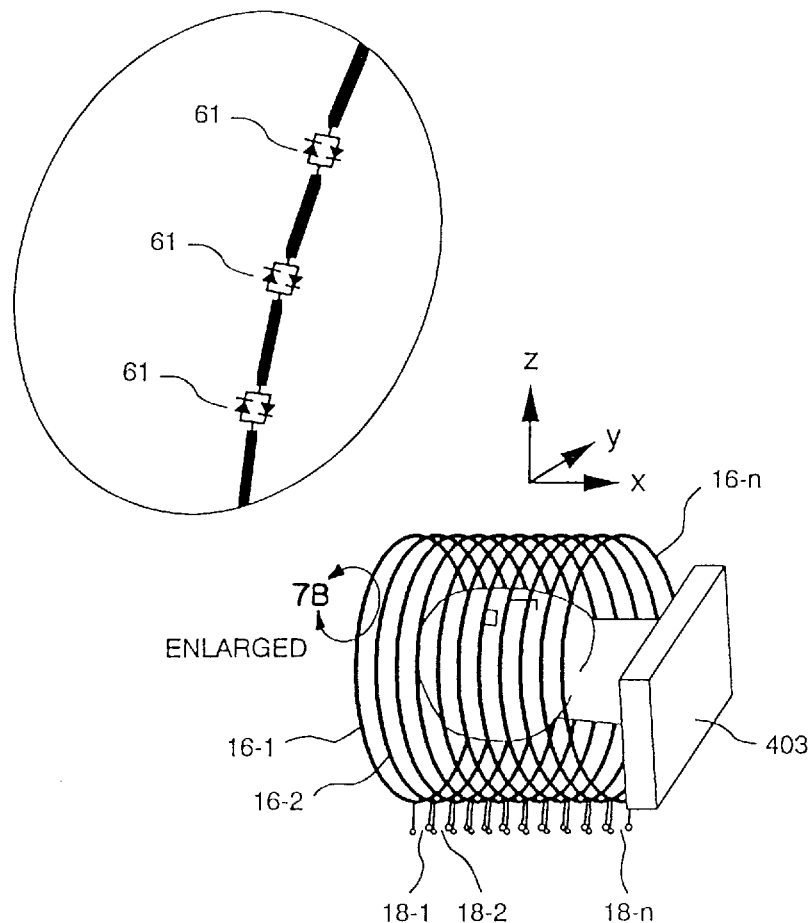
FIGS. 7A and 7B are drawings showing another example of the constitution of the present invention for changing the sensitivity distribution of an RF probe for detection in the specific direction (direction of the body axis) on a time basis according to the Wavelet basis function.

FIGS. 7A and 7B show another example of the constitution of an RF probe for changing the sensitivity distribution of an RF probe for detection in the specific direction (direction of the body axis) on a time basis according to the Wavelet basis function shown in formula 1. The RF probe for detection shown in FIG. 7A has a constitution using a plurality of loop coils 16-1, 16-2, - - -, and 16-n, and each loop coil is connected with a plurality of diodes 61 as shown in the enlarged drawing, of FIG. 7B and the loop coil 16-1 has a feed point 18-1, the loop coil 16-2 a feed point 18-2, - - - , and the loop coil 16-n a feed point 18-n. In the RF probe shown in FIG. 7A, the body axis of the subject 403 almost coincides with the x direction perpendicular to the yz plane formed by each loop coil. The direction of the static magnetic field shown in FIG. 7A is the z-axial direction perpendicular to the x-axial direction.

As time passes, the inspection system controls turning the diodes 61 ON or OFF at high speed and turns only the diodes of two loop coils optionally selected in FIG. 7A ON and the diodes of the other loop coils OFF in the predetermined time zone. The inspection system connects only the feed point of one of the two selected loop coils to the A-D converter 413 via the amplifier 411 shown in FIG. 23 and makes the feed points of the other loop coils all open. Since no current flows through the loop coil whose diodes 61 are turned OFF, the electromagnetic interactions between the selected loop coils and the other loop coils are eliminated. As a result, the sensitivity distribution of the RF probe for detection becomes almost equal to the sensitivity distribution ψ(x) when only the two selected loop coils exist. Whether the electromagnetic interactions between the selected loop coils which can perform a reception operation and the other loop coils are eliminated or not can be confirmed by checking the frequency characteristic of the input impedance of one of the two selected loop coils. When there are no electromagnetic interactions, the resonance frequency becomes equal to that when only the two loop coils exist.

Next, the combination of two loop coils whose diodes are turned ON is changed. Also in this case, the inspection system connects only the feed point of one of the two newly selected loop coils to the A-D converter 413 via the amplifier 411 shown in FIG. 23 and makes the feed points of the other loop coils all open. When the distance between the two newly selected loop coils is larger than that between the two previously selected loop coils, the sensitivity distribution of the two newly selected loop coils is a distribution when ψ(x) is enlarged in the x direction. When the distance between the two newly selected loop coils is inversely smaller than that between the two previously selected loop coils, the sensitivity distribution of the two newly selected loop coils is a distribution when ψ(x) is reduced in the x direction. When the x coordinate positions where the two newly selected loop coils are arranged are different from the x coordinate positions of the two previously selected loop coils, the sensitivity distribution of the two newly selected loop coils is a distribution when ψ(x) is shifted in the X direction. Namely, by ON-OFF control for the diodes 61, the sensitivity distribution of the RF probe for detection can be changed to a distribution when ψ(x) is enlarged or reduced in the x direction or a distribution when ψ(x) is shifted in the x direction.

When the distance between the selected operable loop coils is changed by ON-OFF control for the diodes, the peak frequency of the frequency characteristic of the input impedance also changes, so that by changing the capacity of the capacitor connected to each loop coil (not shown in FIG. 7A for simplicity), the peak having a higher frequency among the two existing peaks of the input impedance is set to the NMR frequency.

For example, as the distance between loop coils decreases, the difference between the two peak frequencies of the input impedance increases. When the distance between loop coils is small, the frequency at the peak 31 shown in FIG. 3 is higher than that when the distance between loop coils is large, so that the capacity of each capacitor connected to each coil is made larger than that when the distance between loop coils is large. A switching element other than a diode may be used as an element for ON-OFF control shown in FIG. 7A without trouble.

FIGS. 8A–8C, 9, and 10 show other examples of the constitution of an RF probe for detection for changing the sensitivity distribution of an RF probe in the specific direction on a time basis according to the Wavelet basis function shown in formula 1. The RF probe shown in FIG. 8A comprises a capacitor 20 and a feed point 18 which are connected almost opposite to each other, a conducting loop 16 arranged almost in parallel with the xy plane, and conductors 17-1, 17-2, - - -, and 17-n which are connected to the conducting loop 16 at both ends thereof and arranged almost in parallel with the yz plane. As shown in the enlarged drawing in FIG. 8B, a plurality of diodes 61 are connected to each of the conductors 17-1, 17-2, - - - , and 17-n in the same way as with the RF probe shown in FIG. 7A. Furthermore, a diode 61 is connected between each of the conductors 17-1, 17-2, - - -, and 17-n and the connection end with the conducting loop 16 respectively as shown in the enlarged drawing in FIG. 8C.

In the RF probe shown in FIG. 7A, when the direction of the static magnetic field (z direction) of the MRI system is perpendicular to the body axial direction of the subject 403, the sensitivity distribution in the body axial direction can be changed according to the Wavelet basis function on a time basis.

On the other hand, when the direction of the static magnetic field (z direction) of the MRI system coincides with the body axial direction, changing of the sensitivity distribution in the direction (x direction) perpendicular to the body axial direction according the Wavelet basis function can be realized by using an RF probe for detection having the constitution shown in FIGS. 8A–8C, 9, and 10. The principle thereof will be explained hereunder.

Figure 8:
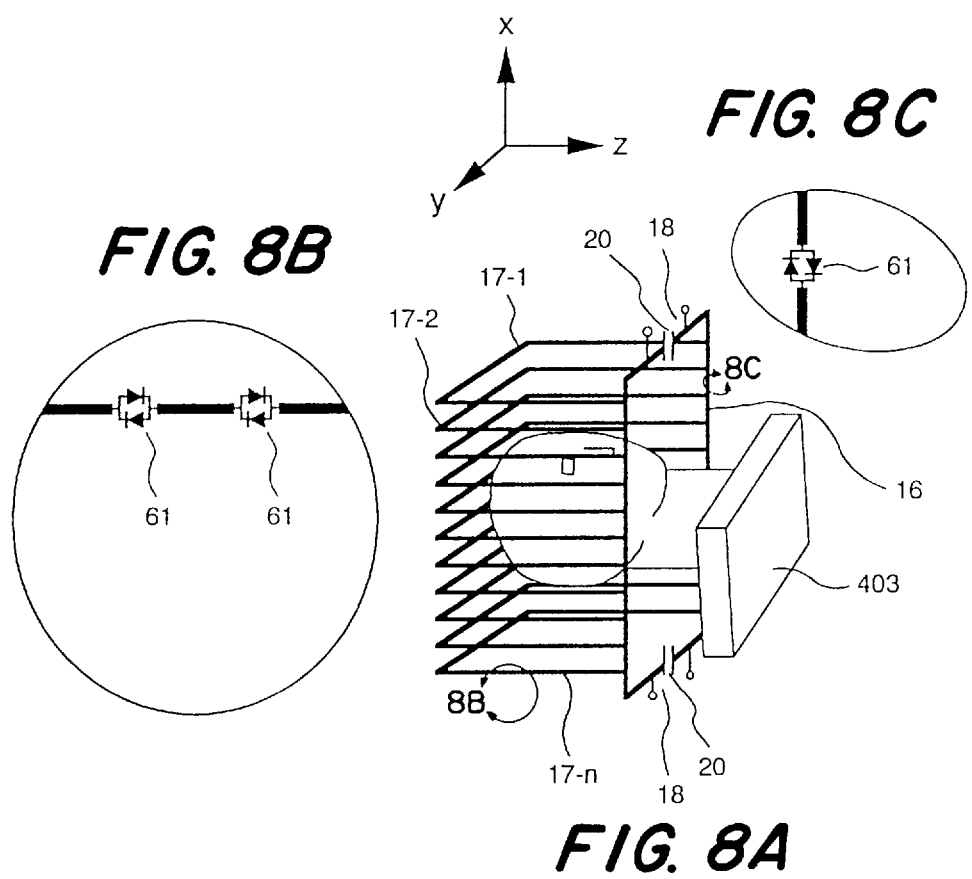
FIGS. 8A, 8B and 8C are drawings showing still another example of the constitution of the present invention for changing the sensitivity distribution of an RF probe for detection in the specific direction on a time basis according to the Wavelet basis function.
Figure 9:
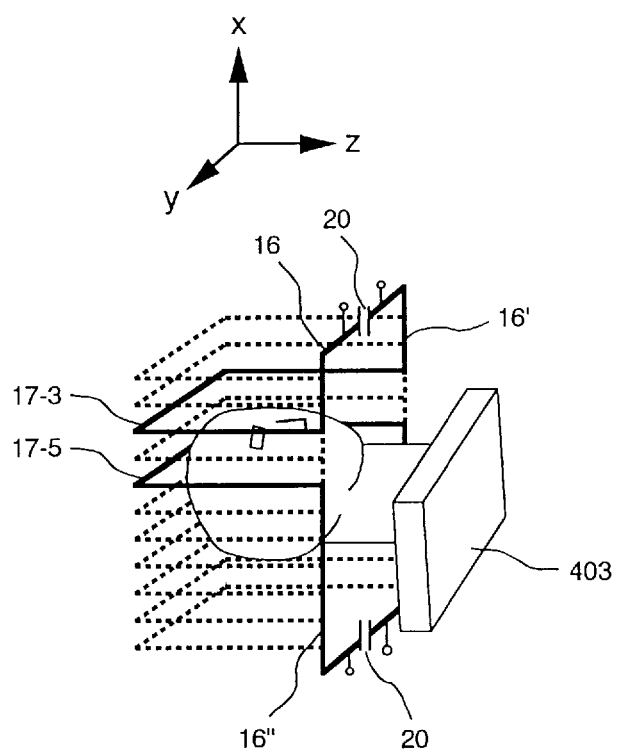
FIG. 9 is an illustration for the constitution for changing the sensitivity distribution of the RF probe for detection in the specific direction shown in FIG. 8A on a time basis.

As the measurement time of an NMR signal passes, only the diodes 61 mounted to the conductor portions indicated by solid lines in FIG. 9 are turned ON by the ON and OFF control for the diodes 61 shown in FIG. 8 in the predetermined time zone and the diodes 61 mounted to the conductor portions indicated by dashed lines shown in FIG. 9 are turned OFF. By this control, the portion 16' in the conducting loop 16 and the conductor 17-3 enter the connection state and the portion 16" and the conductor 17-5 enter the connection state. One of the two feed points is connected to the A-D converter 413 via the amplifier 411 shown in FIG. 23. As a result, no current flows through the conductor portions indicated by the dashed lines, so that the sensitivity distribution of the RF probe for detection shown in FIG. 9 becomes almost equal to the sensitivity distribution when only the conductor portions indicated by the solid lines exist. Also in this case, the frequency characteristic of the input impedance has two peaks and at the peak having a higher frequency among the peaks, the sensitivity distribution on the x axis of the coil becomes almost equal to the sensitivity distribution shown in FIG. 5.

Figure 10:
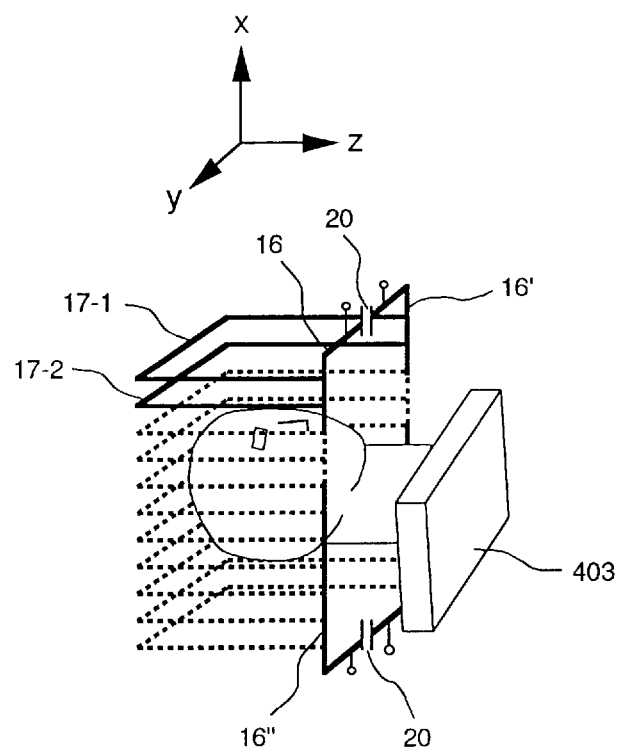
FIG. 10 is an illustration for the constitution for changing the sensitivity distribution of the RF probe for detection in the specific direction shown in FIG. 8 on a time basis.

Next, the conductor portions whose diodes 61 are turned ON in FIG. 8A are changed to the portions (17-1, 17-2) indicated by solid lines in FIG. 10 by the ON-OFF control for the diodes. The diodes 61 mounted to the conductor portions indicated by dashed lines in FIG. 10 are turned OFF. The sensitivity distribution of the RF probe shown in FIG. 10 is a distribution obtained by reducing the RF probe shown in FIG. 9 in the x direction and shifting it in the x direction. By the ON-OFF control for the diodes like this, the sensitivity distribution of the RF probe shown in FIG. 8 can be changed to a distribution obtained by enlarging or reducing the sensitivity distribution $\psi(x)$ shown in FIG. 5 in the x direction or a distribution obtained by shifting it in the x direction.

The sensitivity distribution of the RF probe for detection can be obtained by a phantom imaging experiment or a calculator simulation beforehand. A sensitivity distribution obtained by enlarging or reducing the sensitivity distribution $\psi(x)$ shown in FIG. 5 in the x direction or a sensitivity distribution obtained by shifting it in the x direction can be generated by an RF probe for detection which satisfies the condition of Formula 5 and has the constitution shown in FIGS. 7A or 8A (FIG. 9 or 10). Namely, by changing the ON-OFF control for the diodes on a time basis, the sensitivity of the RF probe for detection can be changed according to the Wavelet basis function.

Next, a method of obtaining a profile in the specific direction (x direction) by changing the sensitivity distribution of the RF probe in the x direction according to the Wavelet basis function for each measurement of signals will be explained concretely. A case that an exciting RF pulse is applied to a subject comprising water using an RF probe for exciting and a free induction decay (FID) signal generated when the whole imaging area is excited is observed will be considered. It is desirable that the sensitivity distribution of the RF probe for exciting is uniform as much as possible in the whole imaging area.

Figure 11:
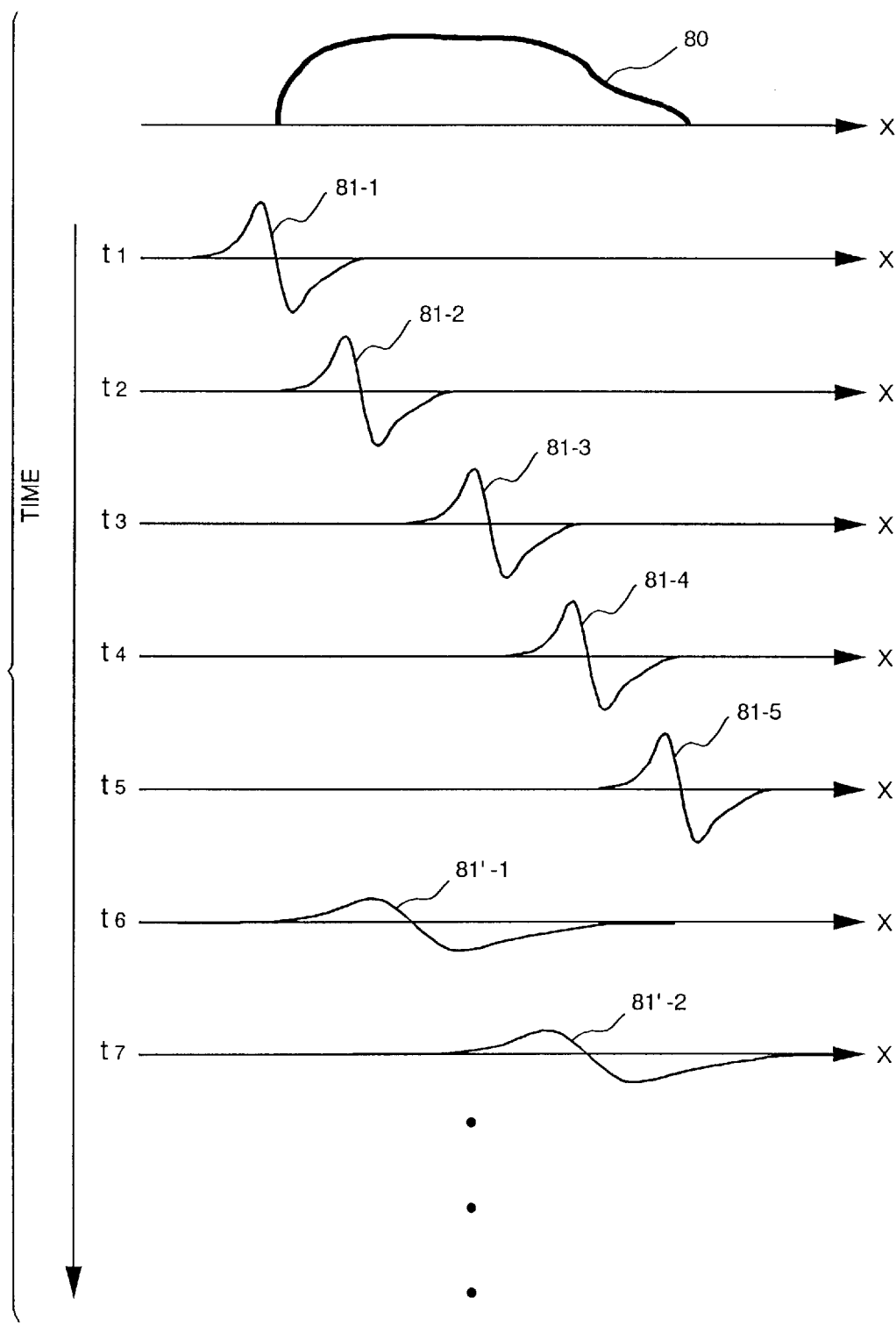
FIG. 11 is a drawing showing an example of the present invention that the sensitivity distribution of an RF probe for detection in the specific direction is changed on a time basis according to the Wavelet basis function.

As shown in FIG. 11, the sensitivity distribution of an RF probe for detection in the x direction having the constitution shown in FIG. 7A or FIG. 8A (FIGS. 9 and 10) is changed according to the Wavelet basis function for each measurement of FID signals and FID signals are measured several times. A signal $S_i$ measured at the i-th is expressed by Formula 9. Namely, an example that the sensitivity distributions 81-2, - - -, and 81-5 of the RF probe for detection in the x direction are those obtained by shifting the sensitivity distribution 81-1 in the X-axial direction and 81'-1 and 81'-2 are those obtained by shifting the sensitivity distribution 81-1 in the X-axial direction and enlarged in the x direction is shown.

$$S_i = \int m(x)\psi i(x)dx \qquad \text{Formula 9}$$

where $\psi(x)$ indicates the sensitivity distribution of the RF probe for detection in the x direction at the i-th measurement, and m(x) indicates the total of nuclear densities in the y-z plane passing each x coordinate, and the range of integral $\int$ is from $-\infty$ to $\infty$. NMR signals are measured by changing the sensitivity of the RF probe for detection successively for all the Wavelet basis functions necessary to perform the inverse Wavelet transform. By performing the inverse Wavelet transform indicated in Formula 10 for a plurality of measured signals $S_i$ (i=1, 2, - - -, and N), an x-profile of a subject 80 can be obtained (addition $\Sigma$ is performed for i=1, 2, - - -, and N).

$$m(x) = \Sigma S_i \psi i(x) \qquad \text{Formula 10}$$

Second embodiment

Figure 12:
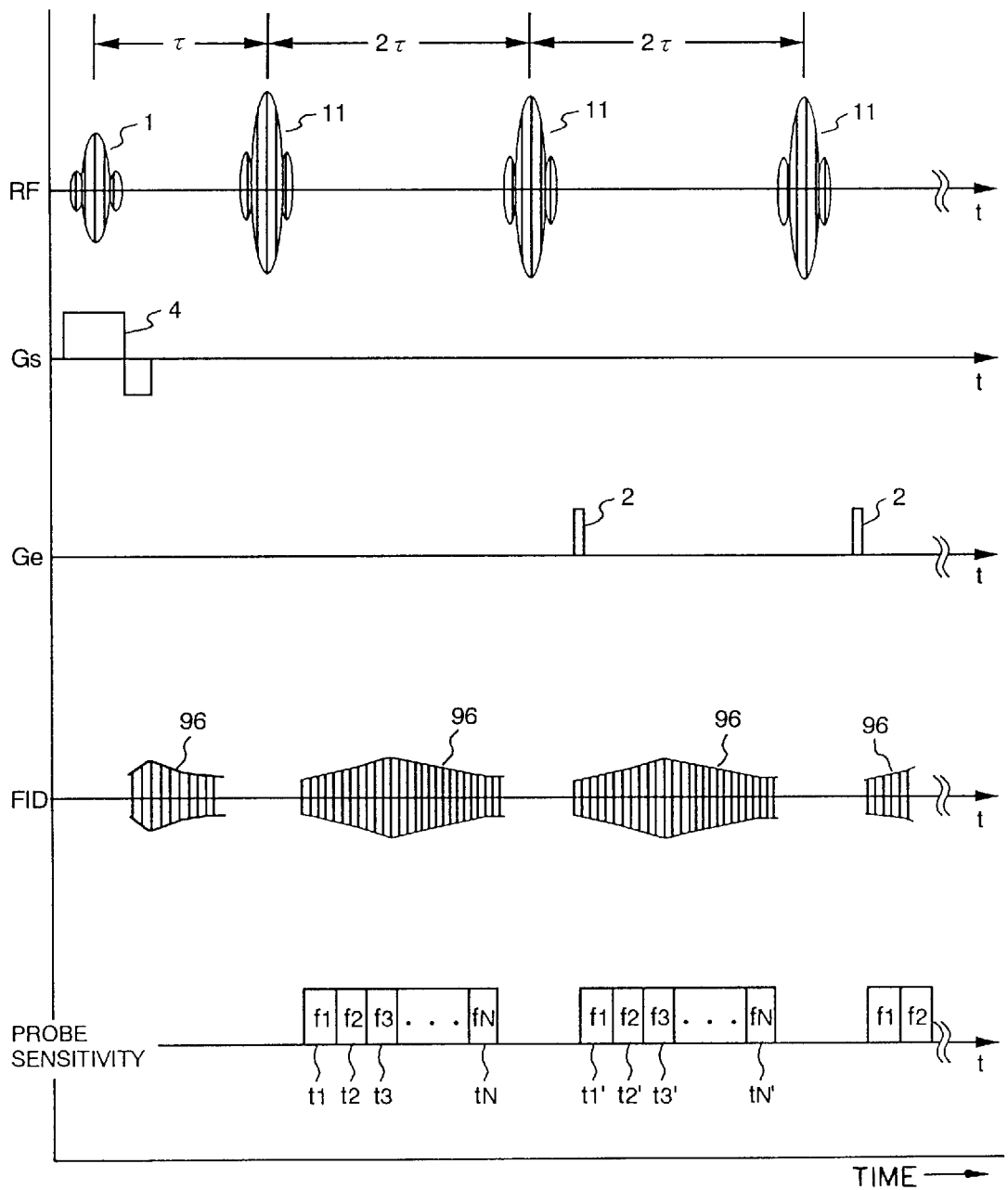
FIG. 12 is an illustration showing a pulse sequence of the present invention for changing the sensitivity distribution of an RF probe for detection in the x direction according to the Wavelet basis function for each measurement of FID signals and measuring the FID signal several times.

FIG. 12 shows an example of an actual pulse sequence of the present invention. When the slicing gradient magnetic field (Gs) 4 and the exciting RF pulse 1 are applied to a subject at the same time using an RF probe for exciting so as to excite the predetermined slice, an FID signal 96 is generated. When a $\pi$ pulse 11 is applied a time of $\tau$ after the exciting RF pulse 1 is applied, the FID 96 decayed once increases again and starts decay again after a fixed time. During this period of time, the FID signal 96 is observed. When a process that a $\pi$ pulse is applied again at a time of $2\tau$ after the $\pi$ pulse 11 is applied is repeated, the FID signal repeats increasing and decreasing. By changing the sensitivity distribution of the RF probe in the x direction successively according to the Wavelet basis function as explained in the first embodiment at each time between two $\pi$ pulses, the FID signal is measured by the RF probe for detection and an x-profile is obtained by the inverse Wavelet transfer from the FID signal. According to the present invention, the sensitivity distribution of the RF probe for detection in the x direction is changed at each time between two $\pi$ pulses. In FIG. 12, the sensitivity distribution f of the RF probe in the x direction is a sensitivity distribution $f_1$ at a time of $t_1$, a sensitivity distribution $f_2$ at a time of $t_2$, - - - -, and a sensitivity distribution $f_N$ at a time of $t_N$. An example of the sensitivity distribution f of the RF probe for detection is as shown in FIG. 10.

To assign position information of the y direction, the phase encoding gradient magnetic field (Ge) 2 is applied for each measurement of FID signals. The amount of addition of the phase encoding gradient magnetic field 2 varies with each measurement, so that a plurality of x-profiles having different position information for the application direction of the phase encoding gradient magnetic field can be obtained. By performing the inverse Fourier transform to these profiles, a two-dimensional image of the excited slice is obtained. Namely, one sheet of image data can be obtained by one excitation by the probe for exciting and a subject can be imaged free of the physical restriction of waiting for magnetization recovery, so that an effect that the imaging time can be shortened can be produced.

Figure 1:
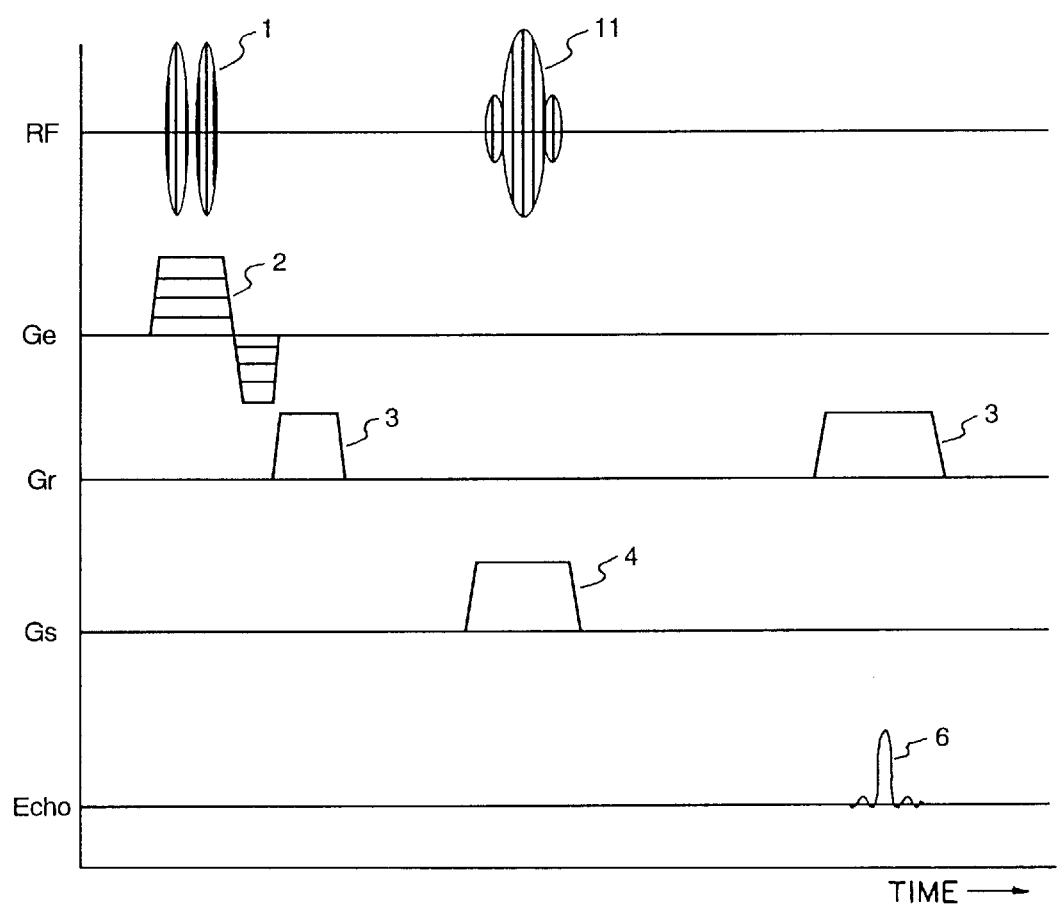
FIG. 1 is a drawing showing a typical pulse sequence of the conventional Wavelet-Encoding imaging.

As a comparison of FIG. 12 with FIG. 1 indicates, according to the present invention, there is no need to apply the read-out gradient magnetic field. When a gradient magnetic field is applied, an eddy current is generated in the conductor portion in the system when the gradient magnetic field is switched and an artifact may appear in an image due to the magnetic field generated by the eddy current. In the prior art, an eddy current is generated when the read-out gradient magnetic field is switched. However, according to the present invention, an effect that no eddy current is generated when the read-out gradient magnetic field is switched is produced. Furthermore, in the prior art, noise is generated when the read-out gradient magnetic field is switched. However, according to the present invention, no noise is caused by switching the read-out gradient magnetic field because the read-out gradient magnetic field is not applied and an effect that a subject is kept away from unnecessary noise is produced.

Figure 13:
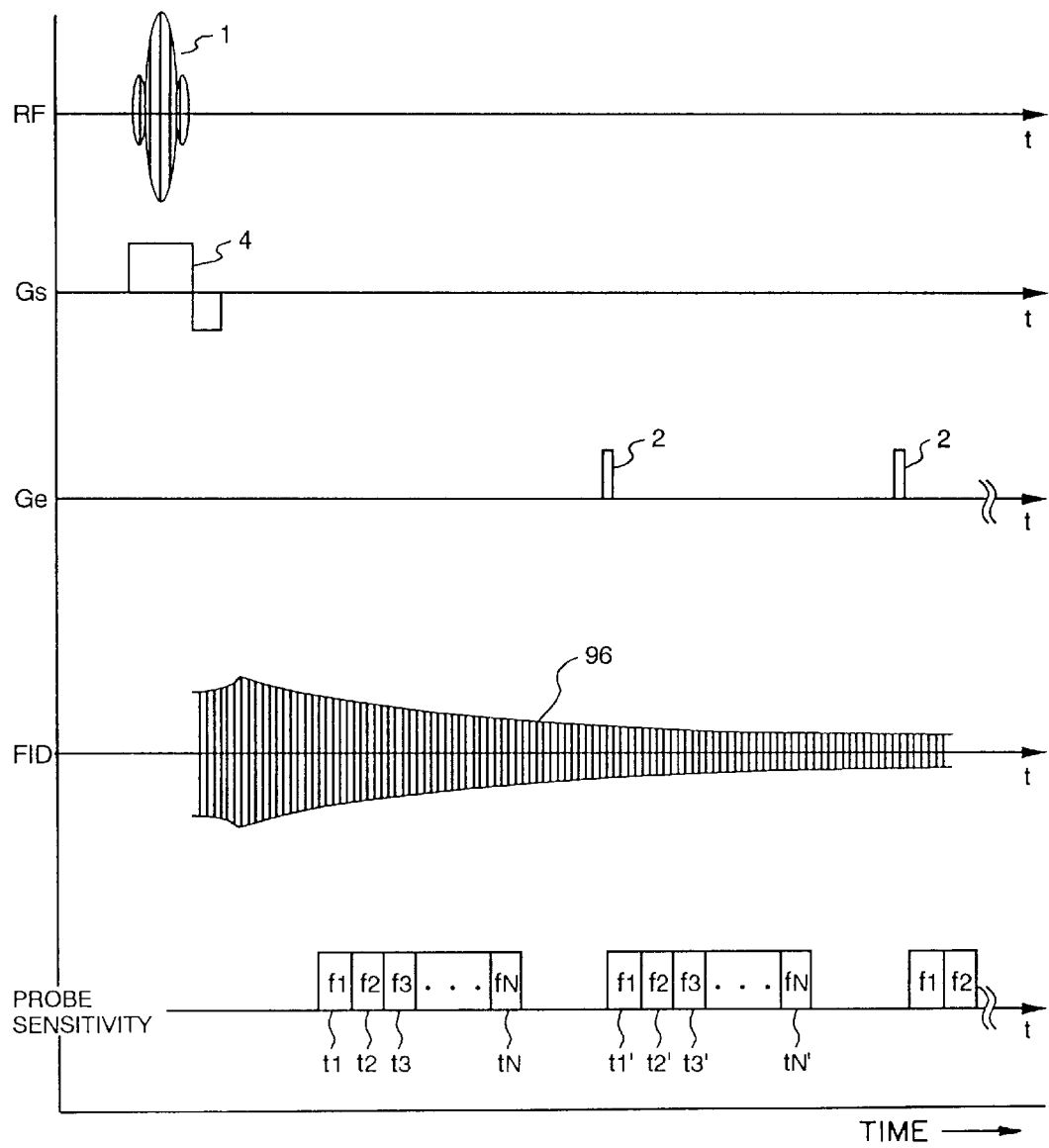
FIG. 13 is a drawing showing another pulse sequence of the present invention for applying the phase encoding gradient magnetic field several times during one decay of an FID signal.

As in the pulse sequence shown in FIG. 13, by applying the phase encoding gradient magnetic field 2 several times during one decay of the FID signal 96, one sheet of image data can be obtained during one decay of the FID signal 96 in the shortest case. For example, assuming that the pixel size of a two-dimensional image is 32×32, and the sampling rate of the A-D converter is 3 μs, and the application time of the exciting RF pulse is 2 ms, the time up to completion of measurement of a signal necessary to obtain a two-dimensional image can be shortened to about 5 ms in the shortest case in this embodiment. In the prior art, when the waiting time for magnetization recovery is set to 1 second because it is necessary to perform excitation several times, it is impossible to set the time required to obtain a two-dimensional image to 1 second or less.

Third embodiment

Figure 14:
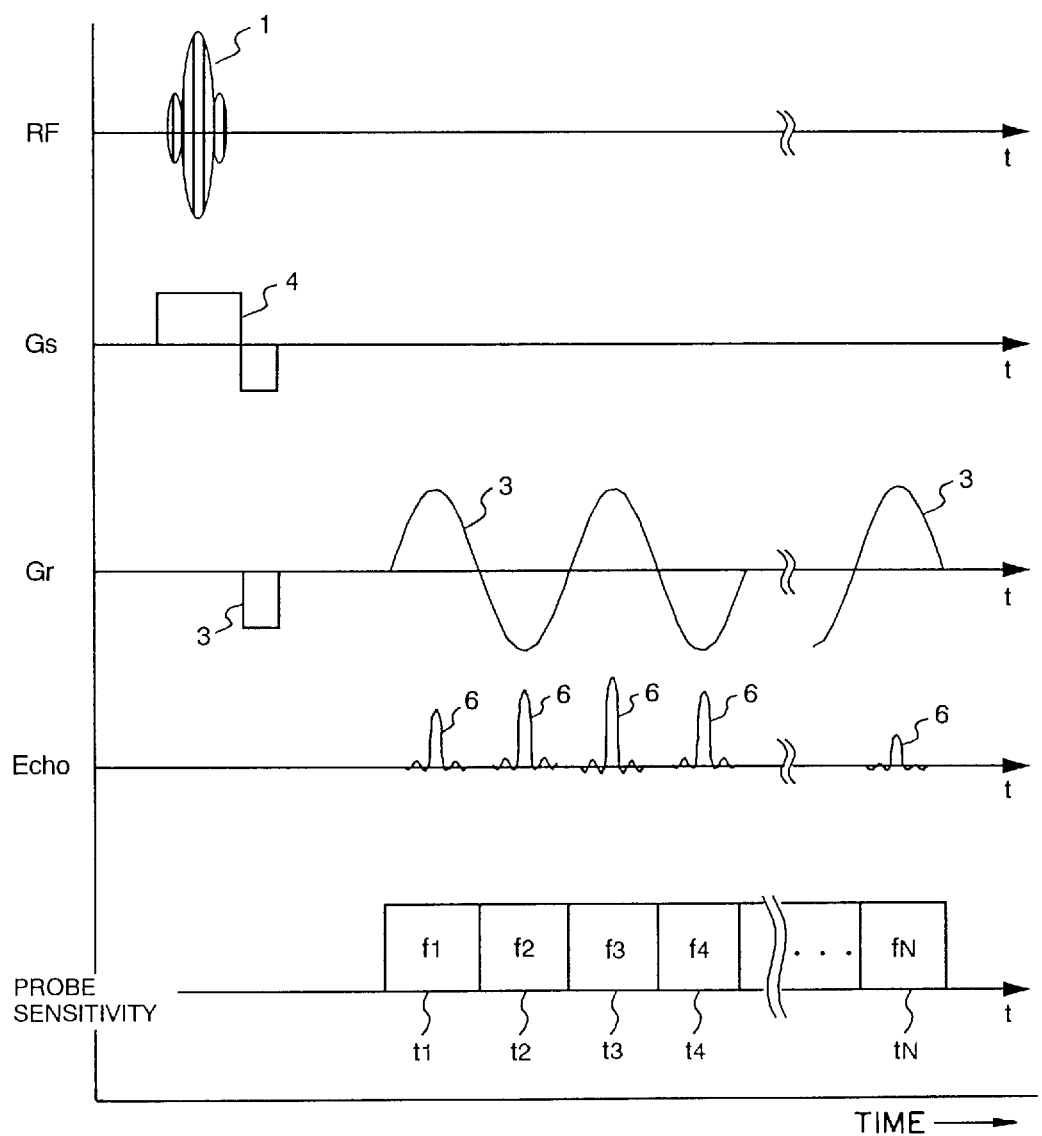
FIG. 14 is a drawing showing still another pulse sequence of the present invention for changing the sensitivity distribution of an RF probe for detection in the encoding direction according to the Wavelet basis function for each measurement of encoding signals.

FIG. 14 shows another example of the pulse sequence for changing the sensitivity distribution of the RF probe for detection in the encoding direction according to the Wavelet basis function for each measurement of echo signals. The slicing gradient magnetic field (Gs) 4 and the exciting RF pulse 1 are applied to a subject at the same time using an RF probe for exciting so as to excite the predetermined slice. Next, when the read-out gradient magnetic field (Gr) 3 vibrating on a time basis is applied, an NMR signal 6 is read via the RF probe for detection. The NMR signal 6 comprises a plurality of echo signals and each echo has position information of the application direction of the read-out gradient magnetic field 3. At the time of reading, as explained in the first embodiment, the sensitivity distribution of the RF probe in the encoding direction is changed according to the Wavelet basis function.

By performing the inverse Fourier transform in the application direction of the read-out gradient magnetic field and the inverse Wavelet transform in the encoding direction respectively, a two-dimensional image of the excited slice is obtained. Namely, one sheet of image data can be obtained by one excitation and a subject can be imaged free of the physical restriction of waiting for magnetization recovery, so that an effect that the imaging time can be shortened can be produced. As a comparison of FIG. 14 with FIG. 1 indicates, according to the present invention, there is no need to apply the phase encoding gradient magnetic field.

When a gradient magnetic field is applied, an eddy current is generated in the conductor portion in the system when the gradient magnetic field is switched and an artifact may appear in an image due to the magnetic field generated by the eddy current. In the prior art, an eddy current is generated when the phase encoding gradient magnetic field is switched. However, according to the present invention, an effect that no eddy current is generated because the phase encoding gradient magnetic field is not applied is produced. Furthermore, in the prior art, noise is generated when the phase encoding gradient magnetic field is switched. However, according to the present invention, since the phase encoding gradient magnetic field is not applied, an effect that a subject is kept away from unnecessary noise is produced.

The present invention is explained above with respect to the Wavelet basis functions approximating the specific sensitivity distribution shown in FIGS. 5 and 6. Also for a Wavelet basis function other than the above, by changing the sensitivity distribution of the RF probe for detection in the predetermined direction according to the Wavelet basis function for each measurement of NMR signals in the same way, one sheet of image data can be obtained by one excitation and a subject can be imaged free of the physical restriction of waiting for magnetization recovery.

Figure 15:
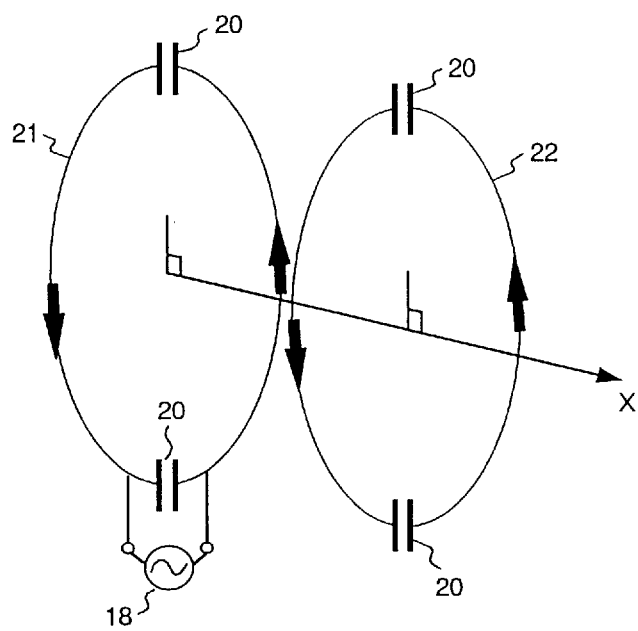
FIG. 15 is a drawing showing the current distribution of the two loop coils shown in FIG. 2.
Figure 16:
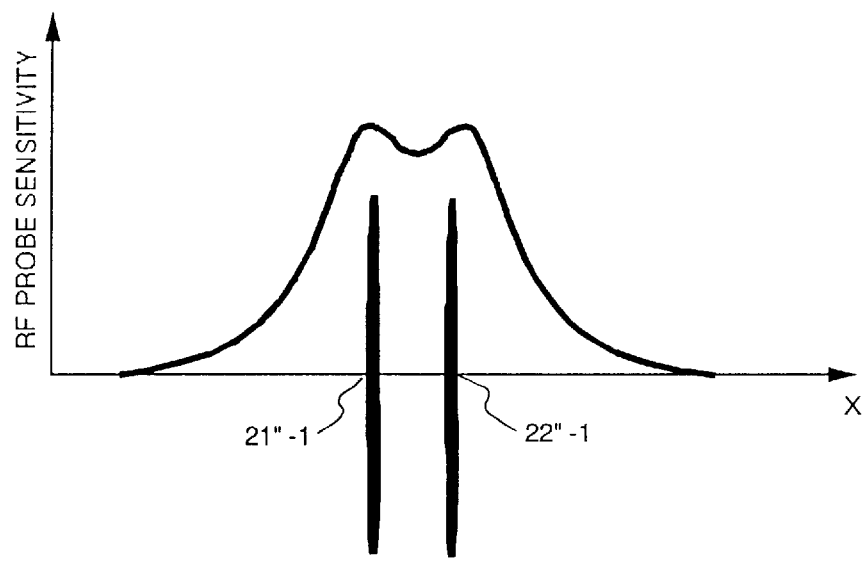
FIG. 16 is a drawing showing the sensitivity distribution of the two loop coils shown in FIG. 2 in the x direction.

Concretely explaining, the current distributions of the coils at the peak having a lower frequency among the two peaks of the frequency characteristic (FIG. 3) of the input impedance of the RF probe shown in FIG. 2 are that the currents in both loop coils flow in the same direction as shown in FIG. 15. When the direction of the static magnetic field of the MRI system is perpendicular to the x direction, the sensitivity distribution of the RF probe in the x direction is as shown in FIG. 16. Assuming that the distance between the peak positions 21"-1 and 22"-1 of the sensitivity distributions of the two loop coils 21 and 22 is a scale parameter and the x coordinate position of the peak position 22"-1 of the sensitivity distribution of the loop coil 22 is a translation parameter, the sensitivity distribution of the RF probe can be switched to a sensitivity distribution obtained by enlarging, reducing, and shifting the sensitivity distribution of the RF probe for detection shown in FIG. 15 in the x direction by using an RF probe for detection which satisfies the condition of Formula 5 and has the constitution shown in FIG. 7A or 8A.

Figure 17:
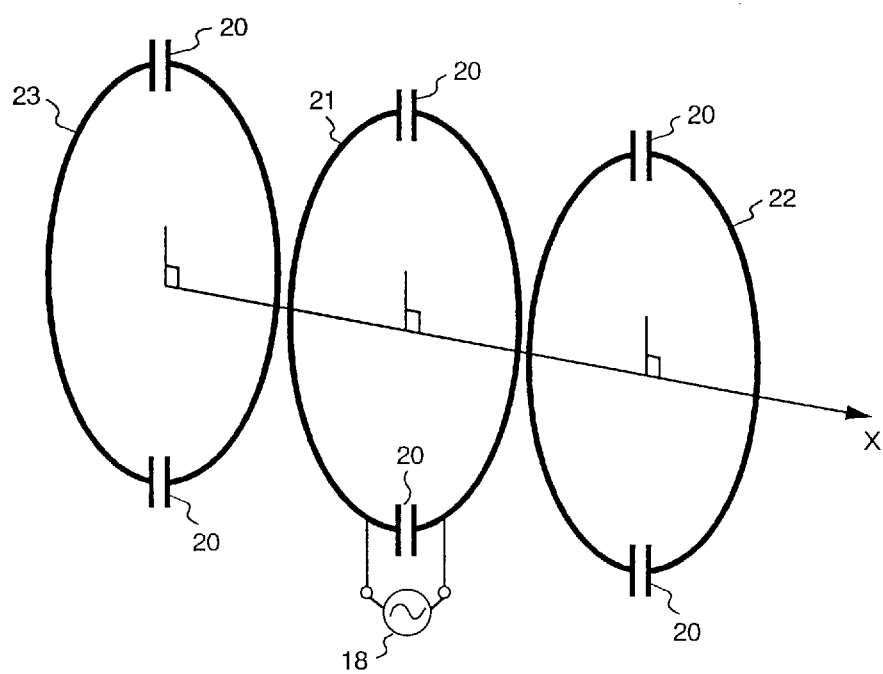
FIG. 17 is a drawing showing the constitution of an RF probe for detection comprising three loop coils of the present invention.
Figure 18:
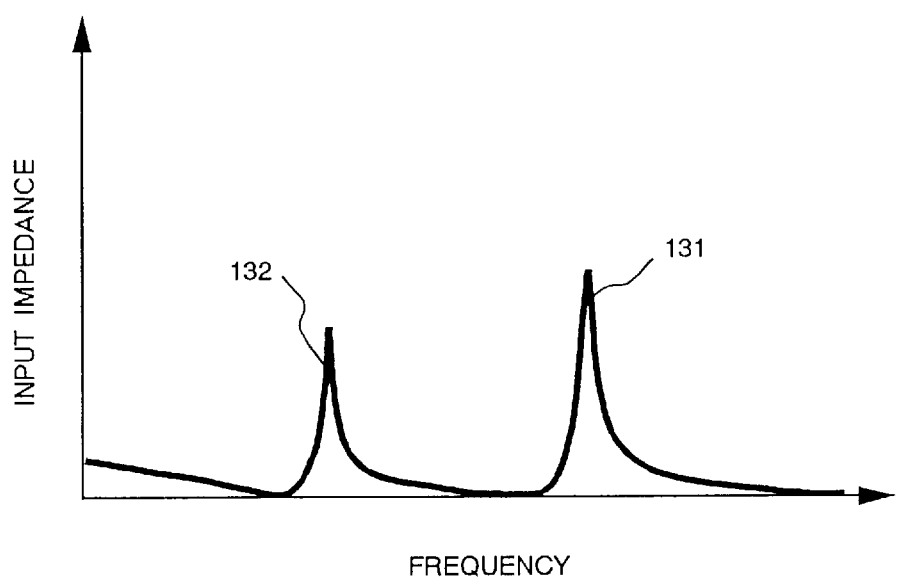
FIG. 18 is a drawing showing the frequency characteristic of the input impedance of the three loop coils shown in FIG. 17.
Figure 19:
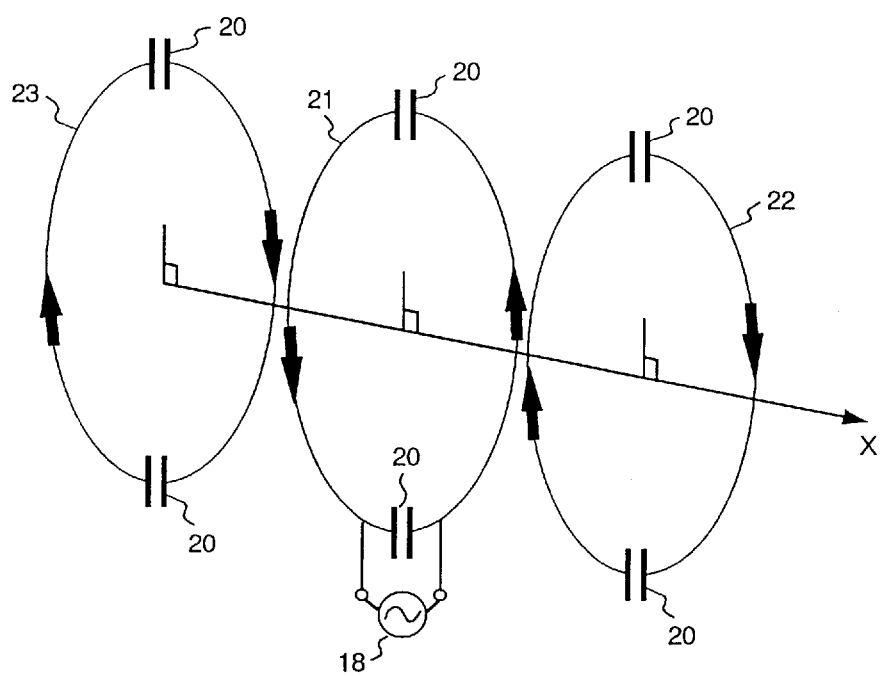
FIG. 19 is a drawing showing the current distribution of the three loop coils shown in FIG. 17.
Figure 20:
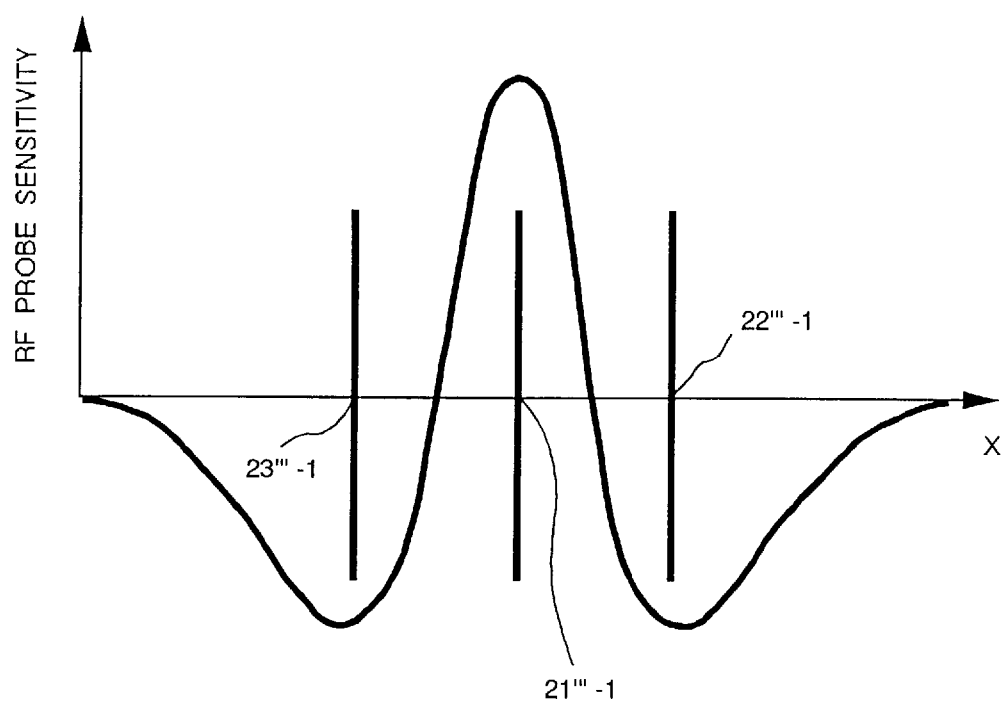
FIG. 20 is a drawing showing the sensitivity distribution of the RF probe for detection shown in FIG. 17 in the x direction.

When three loop coils 21, 22, and 23 are lined up as shown in FIG. 17 and a voltage is supplied to the middle loop coil 21, the frequency characteristic of the input impedance has two peaks 131 and 132 as shown in FIG. 18. The current distributions of the coils at the peak 131 having a highest frequency among the peaks are as shown in FIG. 19. The sensitivity distribution of the coil in the x direction when the direction of the static magnetic field of the MRI system is perpendicular to the x direction is as shown in FIG. 20. Assuming also in this case that the distance between the loop coils is a scale parameter and the x coordinate position of a coil is a translation parameter, the sensitivity distribution of this coil satisfies the condition of Formula 5 and can be switched to a sensitivity distribution obtained by enlarging, reducing, and shifting the sensitivity distribution of the RF probe for detection shown in FIG. 17 or 19 in the x direction by setting the scale parameter and the translation parameter properly.

Figure 21:
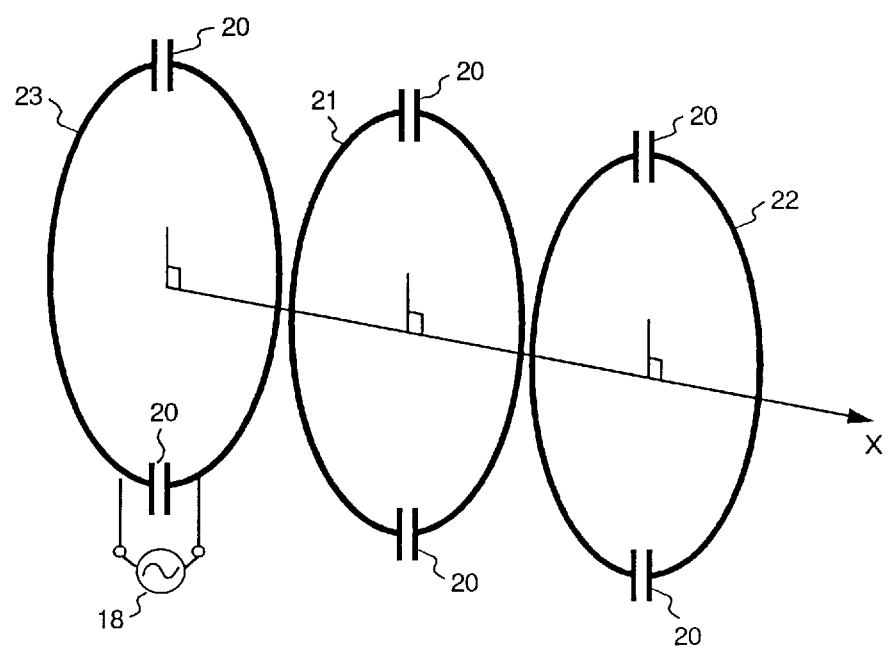
FIG. 21 is a drawing showing the constitution of an RF probe for detection comprising three loop coils of the present invention.
Figure 22:
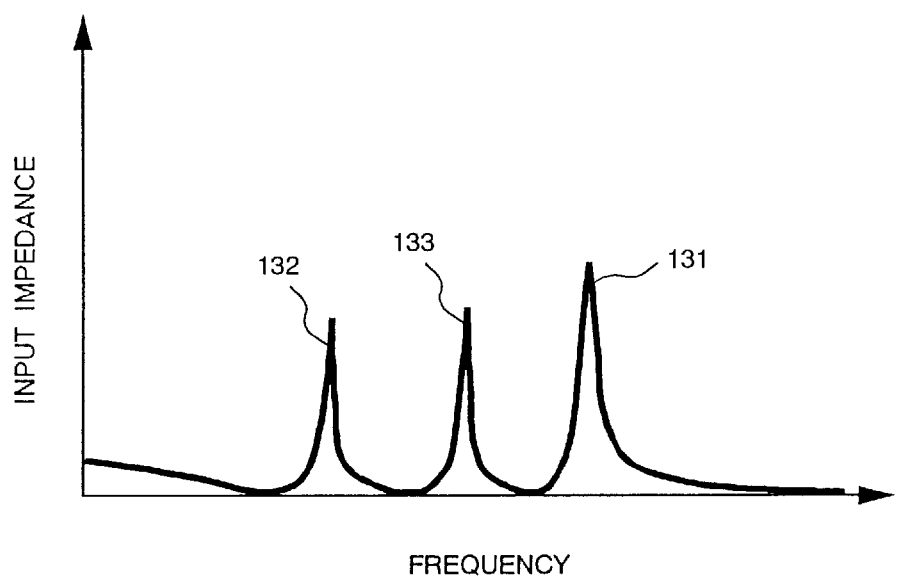
FIG. 22 is a drawing showing the frequency characteristic of the input impedance of the three loop coils shown in FIG. 21.

As shown in FIG. 21, a voltage is supplied to the loop coil 23 at the end of the three loop coils, the frequency characteristic of the input impedance has three peaks 131, 132, and 133 as shown in FIG. 22. At the peak 131 having the highest frequency among the peaks, the sensitivity distribution of the coil in the x direction is almost equal to that shown in FIG. 20. In either case, when the distance between the loop coil 21 and the loop coil 22 or the loop coil 23 is changed, the peak frequency of the input impedance is also changed, so that by changing the capacity of the capacitor 20 connected to each coil, the frequency of the peak to be used of the input impedance among a plurality of existing peaks is set to the NMR frequency.

The present invention is explained above with respect to a case that signals are measured by using an RF probe for changing the sensitivity distribution of an RF probe for detection in the predetermined direction according to the Wavelet basis function for each measurement of NMR signals by turning a plurality of switching elements connected to the RF probe for detection ON or OFF. However, the method of changing the sensitivity distribution of an RF probe for detection in the predetermined direction according to the Wavelet basis function for each measurement is not limited to a method of turning switching elements ON or OFF. For example, it can be realized by sliding the two loop coils shown in FIG. 2 mechanically in the x direction using a linear motor.

The present invention is explained above with respect to the specific imaging sequence. However, also in an imaging sequence other than the above, by changing the sensitivity distribution of the RF probe for detection in the predetermined direction according to the Wavelet basis function for each measurement of signals, one sheet of image data can be obtained by one excitation and a subject can be imaged free of the physical restriction of waiting for magnetization recovery.

Fourth embodiment

Figure 24:
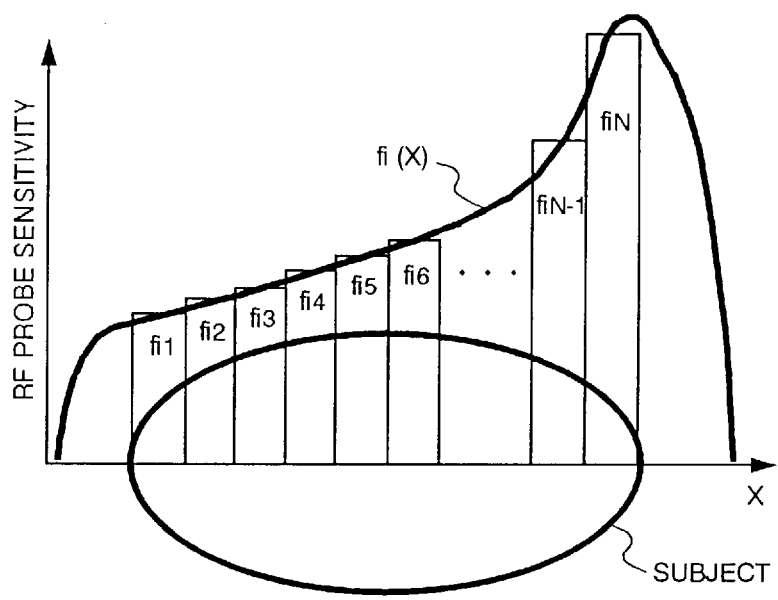
FIG. 24 is an illustration showing the principle of a measurement device using nuclear magnetic resonance of the present invention.

An embodiment of the inspection system using nuclear magnetic resonance of the present invention will be explained hereunder. Before explaining an actual embodiment, the outline of the principle of application of the present invention will be explained first. FIG. 24 is an illustration showing that position information of the X-axial direction of the slice of a subject is obtained by the sensitivity distribution of an RF probe and a distribution change thereof. In FIG. 24, the function $f_i(X)$ indicates a function showing the sensitivity distribution of the RF probe at a time of i and it is a function having at least a gradient in the X-axial direction in the imaging area. As a result, the function fi(X) varies with a change of the time i in the state that it has a gradient in the X-axial direction.

The subject is divided into N sections in the X-axial direction and for example, the mean value of the sensitivity of the RF probe in the j-th section from the left end among the divided sections in FIG. 24 is assumed as $f_{ij}$. The magnetic moment of hydrogen nuclei in the subject existing in the j-th section among the aforementioned divided sections is assumed as $I_j$. The magnetic moment of hydrogen nuclei $I_j$ is a value corresponding to luminance information of a tomographic image.

In this case, the intensity of an FID signal $S_i$ observed via the RF probe at the time i is expressed by the following Formula 11.

$$S_i = a \cdot \Sigma f_{ij} \cdot I_j \qquad \text{Formula 11}$$

In Formula 11, addition Σ is performed for j=1, 2, - - - , and N.

When the function $f_i(X)$ indicating the sensitivity distribution is changed as the time i changes (i=1, 2, - - - , and N), FID signal intensities $S_i$ (i=1, 2, 3, - - - , and N) obtained via the RF probe are expressed by Formula 12 respectively.

$$\begin{bmatrix} S_1 \\ S_2 \\ \vdots \\ S_n \end{bmatrix} = \begin{bmatrix} f_{11} & f_{12} & \cdots & f_{1N} \\ f_{21} & f_{22} & \cdots & \\ \vdots & & & \vdots \\ f_{N1} & \cdots & \cdots & f_{NN} \end{bmatrix} \begin{bmatrix} I_1 \\ I_2 \\ \vdots \\ I_N \end{bmatrix} \qquad \text{Formula 12}$$

In this case, the matrix comprising elements of sensitivity $f_{ij}$ in Formula 12 is called a sensitivity matrix for convenience in later explanation. In Formulas 11 and 12, a symbol "a" indicates a constant. In this relationship of Formulas 11 and 12, $I_j$ (j=1, 2, 3, - - - , and N) is an unknown value which is to be obtained as a value with position information in the X-axial direction assigned to respectively. The reason is that $S_i$ can be observed and each element of the sensitivity matrix can be controlled by obtaining $f_i(X)$ beforehand.

When the sensitivity gradient of the RF probe in the x direction at each time is set so that the sensitivity matrix decided by $f_i(X)$ is reversible, that is, the determinant will not be zero, the sensitivity matrix has an inverse matrix.

Therefore, by using the inverse matrix of the sensitivity matrix, as shown in Formula 13, the magnetic moment Ij of hydrogen nuclei existing in each section which is an unknown value to be obtained can be calculated and an x-profile is obtained.

$$\begin{bmatrix} I_1 \\ I_2 \\ \vdots \\ I_N \end{bmatrix} = (1/a) \begin{bmatrix} f_{11} & f_{12} & \cdots & f_{1N} \\ f_{21} & f_{22} & \cdots & \\ \vdots & & & \vdots \\ f_{N1} & \cdots & \cdots & f_{NN} \end{bmatrix}^{-1} \begin{bmatrix} S_1 \\ S_2 \\ \vdots \\ S_N \end{bmatrix} \qquad \text{Formula 13}$$

As an actual example of $f_i(x)$ when the determinant of the sensitivity matrix does not become zero, a function which can be approximated to a polynomial of second degree or more of X as shown in Formula 14 in the area where a subject exists or a function which can be approximated to an exponential function as shown in Formula 15 may be cited.

$$f_i(X) = b_0 + b_1 X + b_2 X^2 + \qquad \text{Formula 14}$$

$$f_i(X) = \exp(-cX) \qquad \text{Formula 15}$$

As an actual example of $f_i(x)$ when the determinant of the sensitivity matrix becomes zero inversely, a case that $f_i(X)$ can be approximated by a linear expression of X at every time in the area where a subject exists may be cited.

Figure 25:
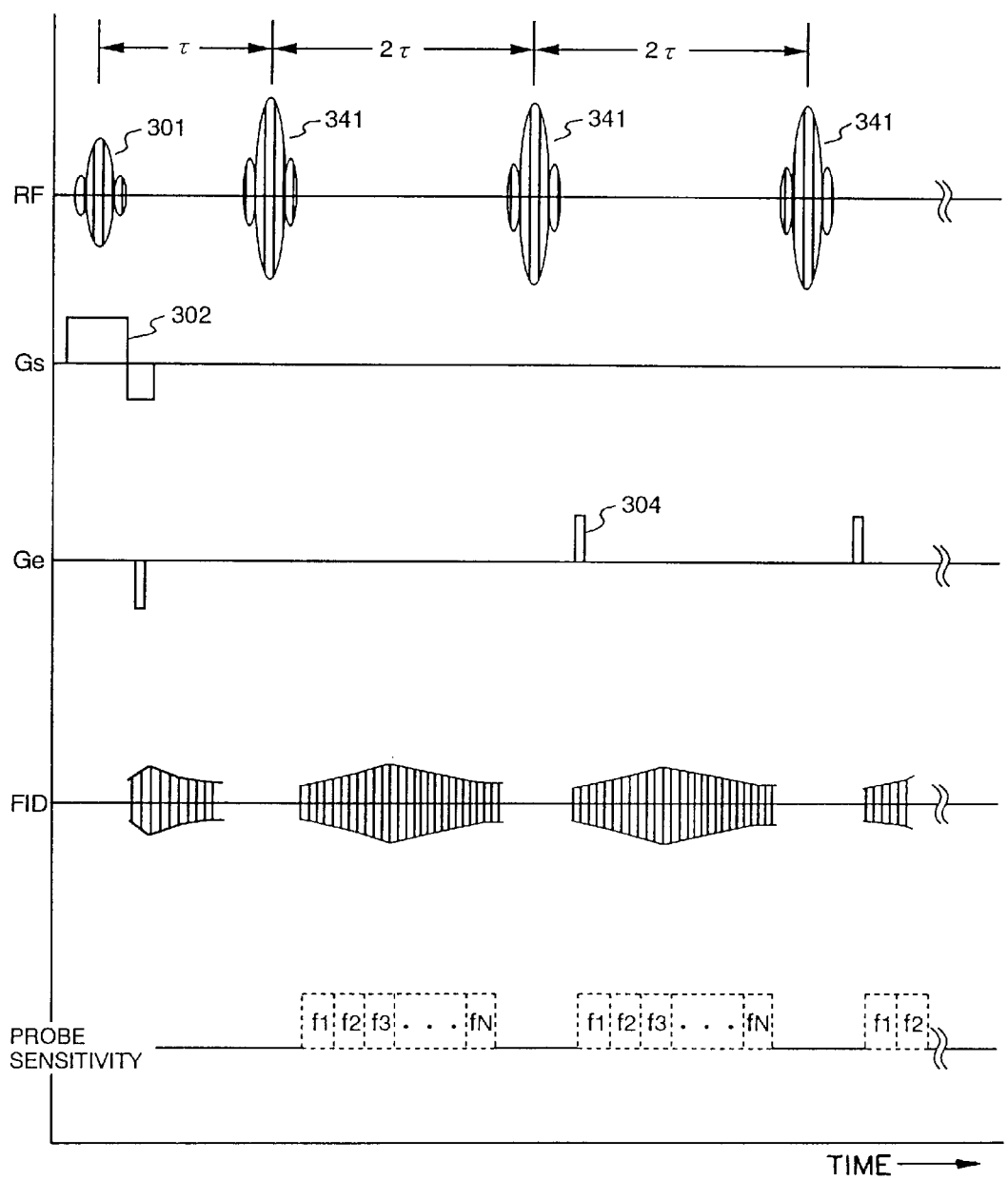
FIG. 25 is an illustration showing an embodiment of a measurement device using nuclear magnetic resonance of the present invention.

Next, an embodiment of the inspection system using NMR of the present invention will be described using the pulse sequence shown in FIG. 25. In FIG. 25, a slicing gradient magnetic field 302 and an exciting RF pulse 301 are applied to a subject at the same time, and a specific slice is excited by it, and an FID signal is observed. When a pulse 341 is applied a time of τ after the exciting RF pulse 1 is applied, the FID 96 decayed once increases again and starts decay again after a fixed time. When a process that a π pulse is applied again a time of 2τ after the π pulse 341 is applied is repeated, the FID signal repeats increasing and decreasing. During this repetition, the phase encoding gradient magnetic field Ge is changed successively and position information of the Y direction is assigned by it.

Between the two π pulses, the FID signal intensities ($S_1$, $S_2$, $S_3$, - - - , and $S_N$) are measured successively by the RF probe by changing the gradient of the x-sensitivity distribution of the RF probe ($f_1$, $f_2$, $f_3$, - - -, and $f_N$) at each time (i=1, 2, 3, - - -, and N).

Figure 26A:
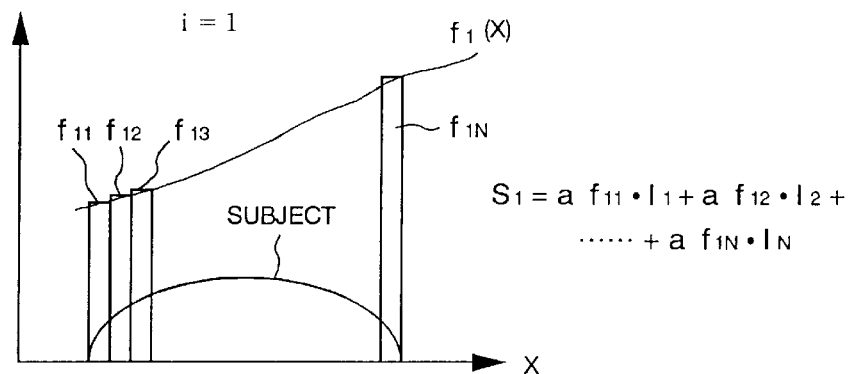
FIGS. 26A, 26B, and 26C are illustrations showing an embodiment of a measurement device using nuclear magnetic resonance of the present invention.
Figure 26B:
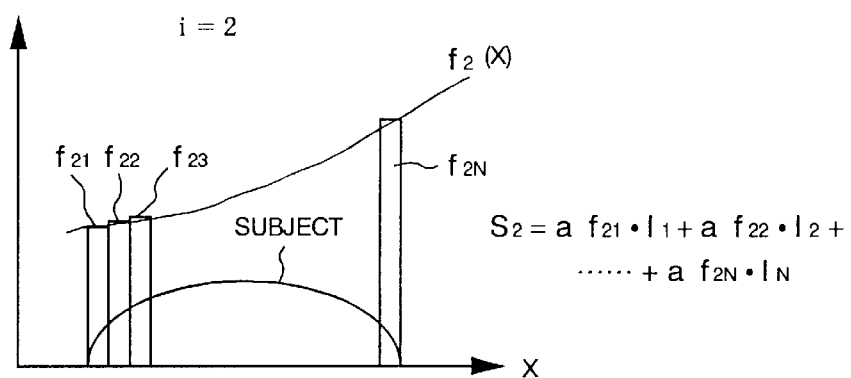
Figure 26C:
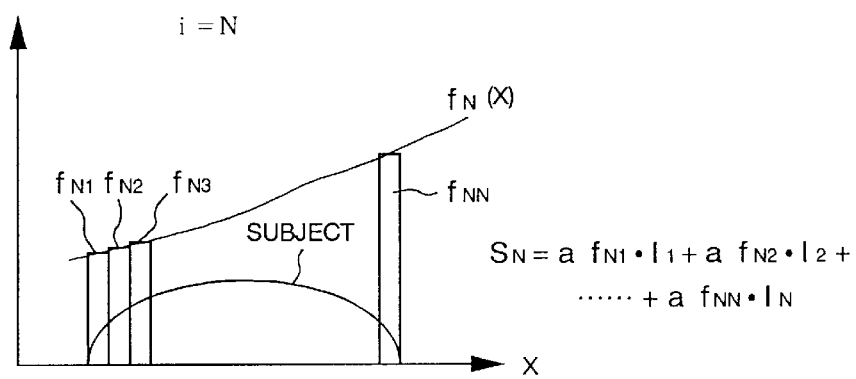

Namely, as shown in FIGS. 26A, 26B, and 26C in correspondence with FIG. 24, when the function of sensitivity distribution $f_1(X)$ is selected at the time i=1 first, the FID signal $S_1$ thereof is outputted (FIG. 26A) as:

$$S_1 = af_{11}I_1 + af_{12}I_2 + af_{13}I_3 + \ldots + af_{1N}I_N$$

When the function of sensitivity distribution $f_2(X)$ is selected at the time i=2, the FID signal $S_2$ thereof is outputted (FIG. 26B) as:

$$S_2 = af_{21}I_1 + af_{22}I_2 + af_{23}I_3 + \ldots + af_{2N}I_N$$

$S_3$, $S_4$, - - - are obtained successively like this and at last, the FID signal $S_N$ is outputted (FIG. 26C) as:

$$S_N = af_{N1}I_1 + af_{N2}I_2 + af_{N3}I_3 + \ldots + af_{NN}I_N$$

Figure 27:
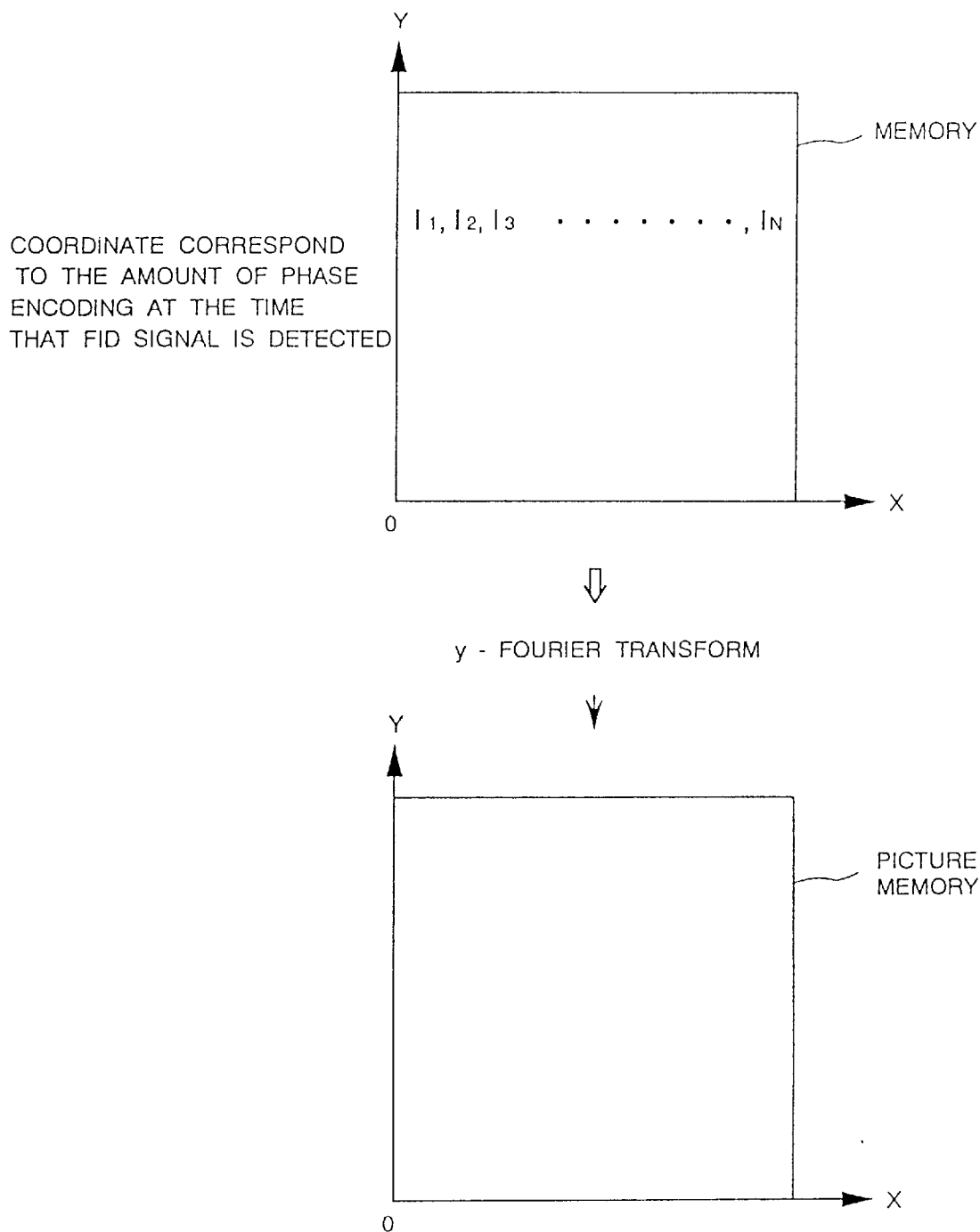
FIG. 27 is an illustration showing an embodiment of a measurement device using nuclear magnetic resonance of the present invention.

By substituting each output of $S_1$, $S_2$, $S_3$, - - -, and SN for Formula 13 mentioned above, $I_1$, $I_2$, $I_3$, - - -, and IN are obtained and these values of $I_1$, $I_2$, $I_3$, - - -, and IN are stored in the memory. As mentioned above, the function of sensitivity distribution $f_i(X)$ changing on a time basis is set beforehand, and the sensitivity distribution is changed on the basis of the set function $f_i(X)$, and I1, I2, I3, - - -, and IN are obtained by a sensitivity matrix derived from the output obtained by it and the function $f_i(X)$. The stored status in the memory is shown in FIG. 27. $I_1$, $I_2$, $I_3$, - - -, and $I_N$ are arranged and stored on the Y-axial coordinates corresponding to the phase encoding gradient magnetic field in the Y-axial direction shown in FIG. 27 respectively along the X-axial direction. This operation is performed successively every changing of the phase encoding gradient magnetic field and by repeating the operation, all the FID signals are stored in the memory. Thereafter, by storing information obtained by performing Fourier transform in the Y direction as shown in FIG. 27 on the basis of the information stored in the memory, for example, in another image memory, two-dimensional image information corresponding to a tomographic image is obtained.

In this embodiment, $I_1$, $I_2$, $I_3$, - - -, and $I_N$ are calculated by using Formula 13. However, there are no restrictions on it. Formula 16 may be used for calculation.

$$\begin{bmatrix} S_1 \\ S_2 \\ \cdot \\ \cdot \\ \cdot \\ S_L \end{bmatrix} = a \begin{bmatrix} f_{11} & f_{12} & \ldots & f_{1N} \\ f_{21} & f_{22} & \ldots & \cdot \\ \cdot & & & \cdot \\ \cdot & & & \cdot \\ \cdot & & & \cdot \\ f_{L1} & \ldots & \ldots & f_{LN} \end{bmatrix}^{-1} \begin{bmatrix} I_1 \\ I_2 \\ \cdot \\ \cdot \\ \cdot \\ I_N \end{bmatrix} \quad \text{Formula 16}$$

The number of measurement points is larger than the number of unknown values N in this case, so that they can be calculated by solving simultaneous equations.

The above explanation shows that in the inspection system using NMR described in this embodiment, position information of the X-axial direction is assigned without applying the read-out gradient magnetic magnetic field and two-dimensional image information is obtained. Therefore, an artifact and noise generated by application of the read-out gradient magnetic field can be suppressed.

Figure 28B:
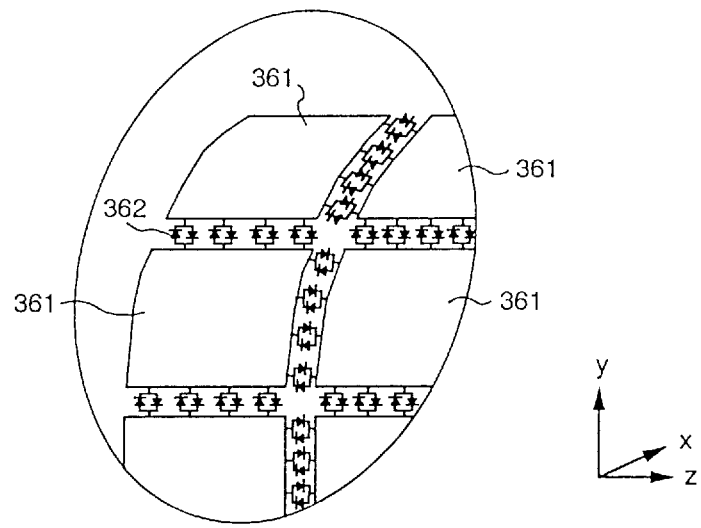
FIGS. 28A and 28B are illustrations showing an embodiment of a measurement device using nuclear magnetic resonance of the present invention which has a sensitivity distribution.
Figure 28A:
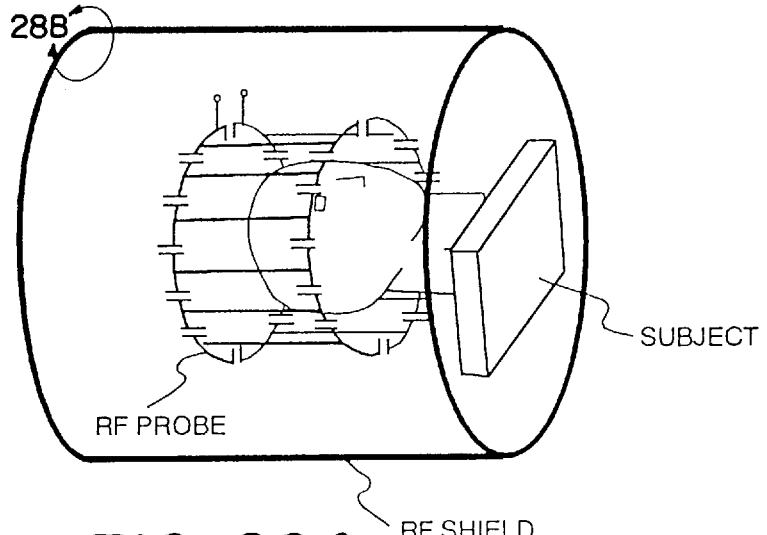
Figure 29A:
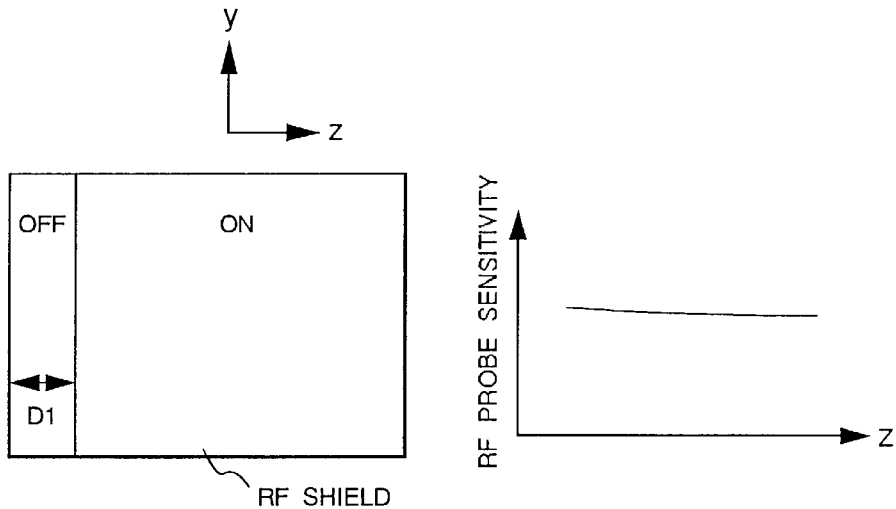
FIGS. 29A, 29B, and 29C are illustrations showing the operation of the device shown in FIG. 28.
Figure 29B:
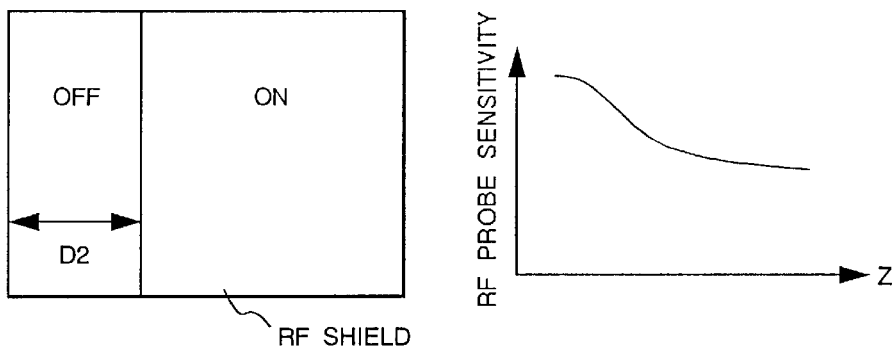
Figure 29C:
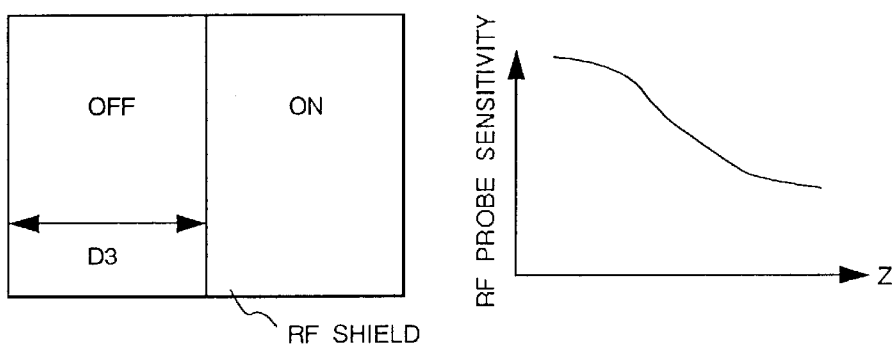

Next, an embodiment of a system for generating a sensitivity gradient of an RF probe will be explained by referring to FIGS. 28A and FIG. 28B. FIG. 28A shows an RF probe installed in an RF shield comprising a group of small conducting planes 361 as shown in FIG. 28B. The conducting planes 361 constituting the RF shield are connected to each other by diodes 362 and each diode 362 can be turned ON or OFF independently. When all the diodes are turned ON, the characteristic of the RF shield comprising a group of small conducting planes 361 becomes almost equivalent to the characteristic of a columnar conducting plane shield. A case that the diodes 362 located within a fixed distance from the end of the RF shield are all turned OFF will be considered now. When the distance D from the end of the RF shield is changed successively to D1, D2, and D3 shown on the left of each of FIGS. 29A, 29B, and 29C, the z-sensitivity distribution inside the RF probe also changes according to the distance from the end of the RF shield as shown on the right of each of FIGS. 29A, 29B, and 29C.

Figure 30:
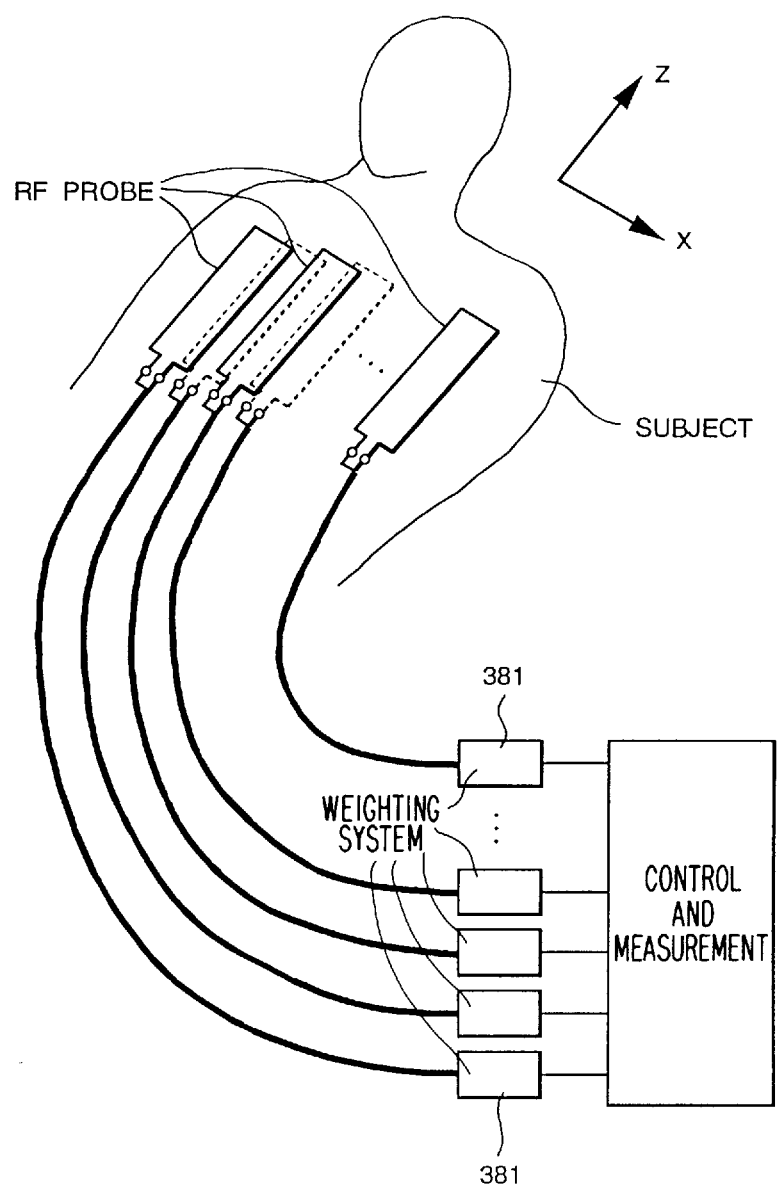
FIG. 30 is an illustration showing another embodiment of a measurement device using nuclear magnetic resonance of the present invention which has a sensitivity distribution.

Furthermore, an embodiment of a system for generating a sensitivity gradient will be explained by referring to FIG. 30. In FIG. 30, there are a plurality of RF probes arranged on a subject and a signal received by each RF probe is weighted and added individually by a weighting system 381. By inclining the magnitude of the weight applied to each signal by a signal from the pulse sequencer and changing the gradient for each measurement, the sensitivity gradient of the RF probe in the x direction in the imaging area can be changed.

Figure 31:
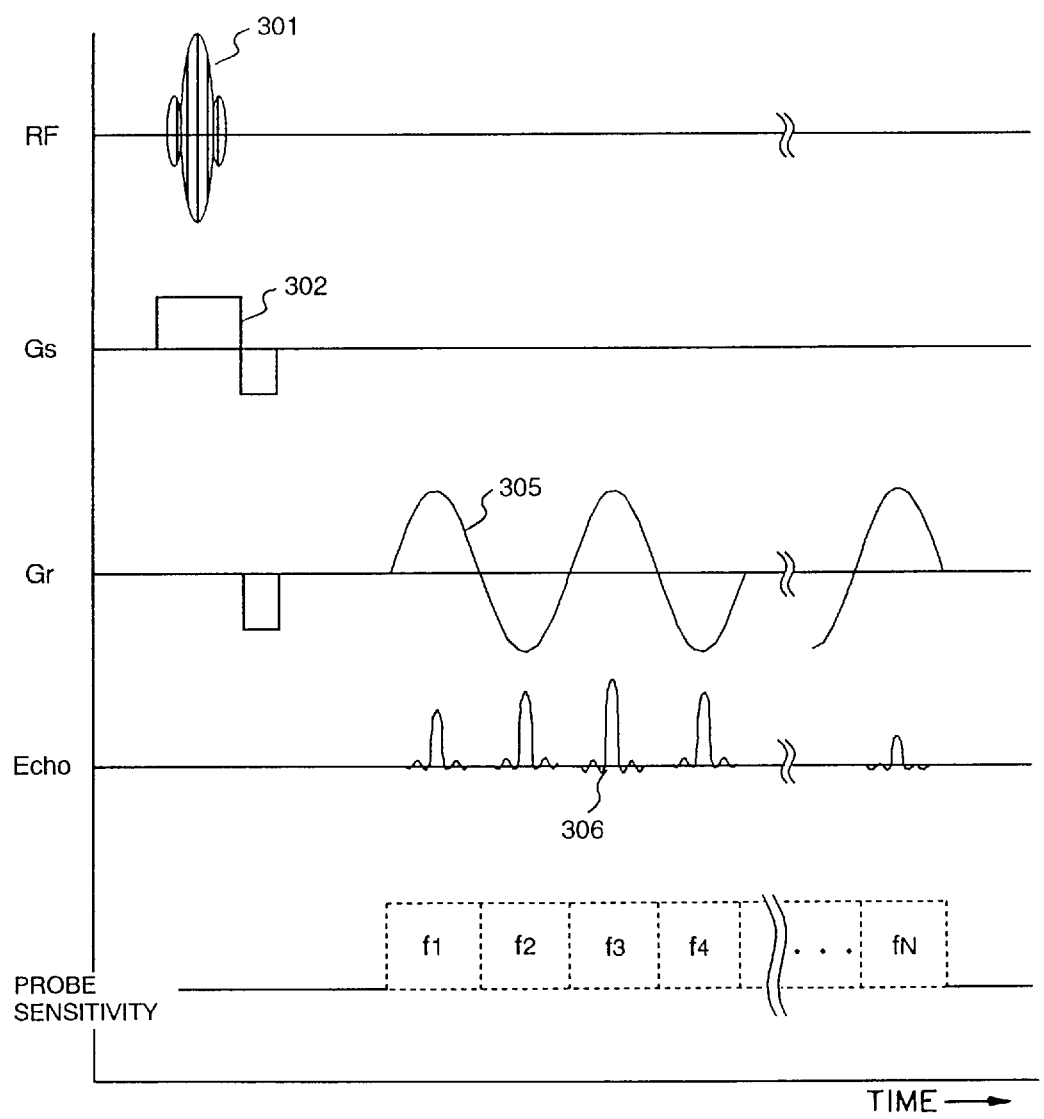
FIG. 31 is an illustration showing another embodiment of a measurement device using nuclear magnetic resonance of the present invention.

Next, an embodiment in which the present invention is applied to another pulse sequence different from the aforementioned pulse sequence will be explained by referring to FIG. 31. In FIG. 31, position information is assigned in the Y-axial direction without using the phase encoding gradient magnetic field. In FIG. 31, the slicing gradient magnetic field 302 and then exciting RF pulse 301 are applied to a subject at the same time so as to excite a specific slice. When the read-out gradient magnetic field 305 is applied to the subject next, the NMR signal 306 is read via the RF probe. The NMR signal 306 comprises a plurality of echo signals and each echo has position information of the application direction of the read-out gradient magnetic field 305. At the time of reading, the sensitivity distribution of the RF probe is inclined according to a different specific function for each measurement of echos in the perpendicular direction (that is, the application direction of the phase encoding gradient magnetic field shown in FIG. 24) to the application direction of the slicing gradient magnetic field and the application direction of the read-out gradient magnetic field. By doing this, the position information of the direction in which the sensitivity distribution of the RF probe is inclined can be encoded to an echo intensity.

An example of the method of obtaining a two-dimensional image from a plurality of measured echo signals like this will be described hereunder. For simplicity of explanation, the application direction of the read-out gradient magnetic field is the x direction, and the direction in which the sensitivity distribution of the RF probe is inclined is the y direction, and the application direction of the slicing gradient magnetic field is the z direction. As mentioned above, each echo has position information of the x direction (the application direction of the read-out gradient magnetic field), so that by performing Fourier transform to each echo, an integral value (x-profile) of a signal generated by the magnetic moment existing on each x coordinate is obtained.

Generally in MRI, the x and y directions are divided into several small sections and displayed by pixels, so that also in this embodiment, the x direction is divided into M sections and the y direction is divided into N sections. An optional one of the M sections in the x direction will be considered now. The integral value of a signal generated by the magnetic moment existing in a specific section in the x direction obtained by performing Fourier transform to the i-th echo is assumed as $S_i$. Furthermore, the y-sensitivity distribution of the RF probe when the i-th echo is obtained is assumed to be inclined in accordance with the specific function fi(y) and the sensitivity of the i-th section when the function is divided into N sections is assumed as $f_{ij}$. The magnetic moment existing in the j-th section when the aforementioned specific section in the x direction is divided into N sections is assumed as $I_1$. Then, $S_i$ is expressed by Formula 11.

Therefore, the relationship between the magnetic moment existing in each section when the aforementioned specific section in the x direction is divided into N sections and the integral value of a signal generated by the magnetic moment existing in the specific section in the x direction obtained by performing Fourier transform to the N echos is expressed by the determinant of the Formula 12. In Formula 12, the magnetic moment $I_j$ is an unknown value to be obtained. The integral value $S_i$ of a signal is observable. Each element of the sensitivity matrix is controllable. When the sensitivity gradient of the RF probe in the y direction when each echo is obtained is set beforehand so that the sensitivity matrix is reversible, that is, the determinant will not be zero, the sensitivity matrix has an inverse matrix. By using the inverse matrix of the sensitivity matrix, as shown in Formula 13, the magnetic moment $I_j$ at each position which is an unknown value to be obtained can be calculated.

As a comparison with the conventional pulse sequence indicates, when the present invention is applied to two-dimensional measurement as in this embodiment, the measurement time is the same as that of the convention method.

The present invention is explained above with respect to the specific imaging sequence. However, also for an imaging sequence other than the above, by changing the sensitivity distribution of the RF probe according to a specific function for each measurement, position information can be obtained without applying the phase encoding gradient magnetic field or the read-out gradient magnetic field.

When the phase encoding gradient magnetic field and the read-out gradient magnetic field are installed and furthermore the encoding gradient magnetic field is installed also in the slice direction, in an inspection system using NMR for measuring a three-dimensional image, needless to say, the present invention can be applied in place of the encoding gradient magnetic field in the slice direction.

What is claimed is:

1. An inspection system using nuclear magnetic resonance comprising magnetic field generators for generating at least one of a static magnetic field, a gradient magnetic field, and an RF magnetic field, an RF probe for detecting NMR signals from a subject, and a calculator for operating detected signals by said RF probe, wherein said inspection system includes means for changing the sensitivity distribution of said RF probe in a predetermined direction according to the Wavelet basis function for each measurement of said NMR signals.

2. An inspection system using nuclear magnetic resonance according to claim 1, wherein said NMR signals are measured by changing the sensitivity distribution of said RF probe which is to be changed several times according to the Wavelet basis function repeatedly several time by changing the amount of addition of the phase encoding gradient magnetic field and two-dimensional image information is obtained by performing inverse Wavelet transform to said NMR signals in said predetermined direction and inverse Fourier transform in the application direction of said phase encoding gradient magnetic field.

3. An inspection system using nuclear magnetic resonance according to claim 1, wherein data is obtained by applying the read-out gradient magnetic field in synchronization with changing of the sensitivity distribution of said RF probe in said predetermined direction several times according to the Wavelet basis function and then two-dimensional image information is obtained by performing inverse Wavelet transform to said data in said predetermined direction and inverse Fourier transform in the application direction of said read-out gradient magnetic field.

4. An inspection system using nuclear magnetic resonance comprising magnetic field generators for generating at least one of a static magnetic field, a gradient magnetic field, and an RF magnetic field, an RF probe for detecting NMR signals from a subject, and a calculator for operating detected signals by said RF probe, wherein said RF probe includes a plurality of switching elements and changes a sensitivity distribution by turning said switching elements ON or OFF for each measurement of said NMR signals, and said inspection system changes the sensitivity distribution of said RF probe in a predetermined direction according to the Wavelet basis function for each measurement of said NMR signals.

5. An inspection system using nuclear magnetic resonance according to claim 4, wherein said RF probe comprises a plurality of coils arranged in said predetermined direction.

6. An inspection system using nuclear magnetic resonance comprising magnetic field generators for generating at least one of a static magnetic field, a gradient magnetic field, and an RF magnetic field, an RF probe for detecting NMR signals from a subject, and a calculator for operating detected signals by said RF probe, wherein said RF probe comprises a plurality of coils arranged in a predetermined direction and includes a plurality of switching elements, and said inspection system selects two or more coils from said plurality of coils for each measurement of said NMR signals, turns said switching elements connected to said selected coils ON, turns said switching elements connected to coils other than said selected coils OFF, changes said combination of two or more coils for each measurement of said NMR signals, and changes a sensitivity distribution of said RF probe in the predetermined direction according to the Wavelet basis function for each measurement of said NMR signals.

7. An inspection system using nuclear magnetic resonance according to claim 6, wherein in the frequency characteristic of the input impedance of said RF probe when said inspection system selects two coils from said plurality of coils for each measurement of said NMR signals, turns said switching elements connected to said selected coils ON, and turns said switching elements connected to coils other than said selected coils OFF, said inspection system sets the peak having a higher frequency among the two existing peaks to the NMR frequency.

8. An inspection system using nuclear magnetic resonance according to claim 6, wherein in the frequency characteristic of the input impedance of said RF probe when said inspection system selects two coils from said plurality of coils for each measurement of said NMR signals, turns said switching elements connected to said selected coils ON, and turns said switching elements connected to coils other than said selected coils OFF, said inspection system sets the peak having a lower frequency among the two existing peaks to the NMR frequency.

9. An inspection system using nuclear magnetic resonance of an RF probe according to claim 6, wherein in the frequency characteristic of the input impedance of said RF probe when said inspection system selects three coils from said plurality of coils for each measurement of said NMR signals, turns said switching elements connected to said three selected coils ON, and turns said switching elements connected to coils other than said selected coils OFF, said inspection system sets the peak having a highest frequency among the existing peaks to the NMR frequency.

10. An inspection system using nuclear magnetic resonance according to claim 6, wherein the coil distance between said two or more selected coils is a scale parameter of Wavelet transform and each coil coordinate is a translation parameter.

11. An RF probe for detecting NMR signals from a subject used in an inspection system using nuclear magnetic resonance comprising magnetic field generators for generating at least one of a static magnetic field, a gradient magnetic field, and an RF magnetic field, and a calculator for operating said NMR signals, wherein said RF probe has means for changing the sensitivity distribution of said RF probe in a predetermined direction according to the Wavelet basis function for each measurement of said NMR signals.

12. An RF probe for detecting NMR signals from a subject used in an inspection system using nuclear magnetic resonance comprising magnetic field generators for generating at least one of a static magnetic field, a gradient magnetic field, and an RF magnetic field, and a calculator for operating said NMR signals, wherein said RF probe includes a plurality of switching elements, changes a sensitivity distribution by turning said switching elements ON or OFF for each measurement of said NMR signals, and changes the sensitivity distribution of said RF probe in a predetermined direction according to the Wavelet basis function for each measurement of said NMR signals.

13. An RF probe according to claim 12, wherein said RF probe comprises a plurality of coils arranged in said predetermined direction.

14. An RF probe for detecting NMR signals from a subject used in an inspection system using nuclear magnetic resonance comprising magnetic field generators for generating at least one of a static magnetic field, a gradient magnetic field, and an RF magnetic field, and a calculator for operating said NMR signals, wherein said RF probe comprises a plurality of coils arranged in a predetermined direction, includes a plurality of switching elements, selects two or more coils from said plurality of coils for each measurement of said NMR signals, turns said switching elements connected to said selected coils ON, turns said switching elements connected to the coils other than said selected coils OFF, changes said combination of two or more coils for each measurement of said NMR signals, and changes a sensitivity distribution of said RF probe in the predetermined direction according to the Wavelet basis function for each measurement of said NMR signals.

15. An RF probe according to claim 14, wherein in the frequency characteristic of the input impedance of said RF probe when said RF probe selects two coils from said plurality of coils for each measurement of said NMR signals, turns said switching elements connected to said selected coils ON, and turns said switching elements connected to coils other than said selected coils OFF, said RF probe sets the peak having a higher frequency among the two existing peaks to the NMR frequency.

16. An RF probe according to claim 14, wherein in the frequency characteristic of the input impedance of said RF probe when said RF probe selects two coils from said plurality of coils for each measurement of said NMR signals, turns said switching elements connected to said selected coils ON, and turns said switching elements connected to coils other than said selected coils OFF, said RF probe sets the peak having a lower frequency among the two existing peaks to the NMR frequency.

17. An RF probe according to claim 14, wherein in the frequency characteristic of the input impedance of said RF probe when said inspection system selects three coils from said plurality of coils for each measurement of said NMR signals, turns said switching elements connected to said three selected coils ON, and turns said switching elements connected to coils other than said selected coils OFF, said RF probe sets the peak having a highest frequency among the existing peaks to the NMR frequency.

18. An RF probe according to claim 14, wherein the coil distance between said two or more selected coils is a scale parameter of Wavelet transform and each coil coordinate is a translation parameter.

19. An inspection system using nuclear magnetic resonance comprising means for generating a gradient magnetic field for specifying the slice of a subject and means for assigning position informations of the X and Y directions intersecting orthogonally each other on said slice to an MR signal from said subject, wherein as means for assigning position information of one direction such as the X direction or the Y direction, said inspection system has means for providing a sensitivity distribution inclined in said one direction to an RF probe for detecting said NMR signal and changing said sensitivity distribution.

20. An inspection system using nuclear magnetic resonance according to claim 19, wherein as means for providing a gradient sensitivity distribution to said RF probe and changing said sensitivity distribution, said inspection system has an RF shield comprising a group of small conducting planes arranged in the periphery around said RF probe and means for performing electrical conduction or electrical separation between neighboring planes is arranged between said neighboring planes.

21. An inspection system using nuclear magnetic resonance according to claim 19, wherein as means for providing a gradient sensitivity distribution to said RF probe and changing said sensitivity distribution, said RF probe comprises a plurality of RF probes and said inspection system has means for weighting each output of said plurality of RF probes according to said sensitivity distribution and said change.

22. An inspection system using nuclear magnetic resonance comprising means for generating a gradient magnetic field for specifying the slice of a subject and means for assigning position informations of the X and Y directions intersecting orthogonally each other on said slice to an MR signal from said subject, wherein as means for assigning position information of one direction such as the X direction or the Y direction, said inspection system has means for providing a sensitivity distribution inclined in said one direction to an RF probe for detecting said NMR signal and changing said sensitivity distribution, and said sensitivity distribution of said RF probe and said distribution change are set on the basis of preset data, and density information of the nuclear spin is generated from said measured MR signal by the processing using said data.

23. An inspection system using nuclear magnetic resonance according to claim 22, wherein said sensitivity distribution of said RF probe and said distribution change are set on the basis of a preset function.

24. An inspection system using nuclear magnetic resonance according to claim 22, wherein said sensitivity distribution of said RF probe and said distribution change are set on the basis of a function which can be approximated to a polynomial of second degree or more.

25. An inspection system using nuclear magnetic resonance according to claim 22, wherein said sensitivity distribution of said RF probe and said distribution change are set on the basis of a function which can be approximated to an exponential function.

26. An inspection system using nuclear magnetic resonance according to claim 22, wherein preset data of said sensitivity distribution of said RF probe and said distribution change is expressed by a determinant and generation of a profile is operated on the basis of the inverse determinant of said determinant.

27. An inspection system using nuclear magnetic resonance according to claim 22, wherein said density information of the nuclear spin along said one direction obtained form said MR signal which is assigned position information of another direction different from said one direction and measured is stored in the memory according to a change of said position information of another direction and then Fourier transform with respect to said one direction is performed for it so as to obtain image information.

28. An inspection system using nuclear magnetic resonance comprising gradient magnetic field generators for generating at least one of a phase encoding gradient magnetic field and a read-out gradient magnetic field and means for assigning encoding in the slicing direction and measuring a three-dimensional image of a subject, wherein said means for assigning encoding in said slicing direction has an RF probe for detecting said NMR signal and means for providing a sensitivity distribution inclined in the direction coinciding with said slicing direction to said RF probe and changing said sensitivity distribution.

29. An inspection system using nuclear magnetic resonance comprising means for generating a gradient magnetic field for specifying the slice of a subject and means for assigning position information of one of the directions intersecting orthogonally each other an said slice to an MR signal from said subject, wherein as means for assigning said position information of said one direction, said inspection system has means for providing a sensitivity distribution inclined in said one direction to an RF probe for detecting said NMR signal and changing said sensitivity distribution.

* * * * *